US012615067B2

(12) United States Patent
Ozawa et al.

(10) Patent No.: US 12,615,067 B2
(45) Date of Patent: Apr. 28, 2026

(54) RECEPTION APPARATUS

(71) Applicant: SONY SEMICONDUCTOR SOLUTIONS CORPORATION, Kanagawa (JP)

(72) Inventors: Nobuhisa Ozawa, Kanagawa (JP); Yoshihisa Takaike, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 279 days.

(21) Appl. No.: 18/253,690

(22) PCT Filed: Nov. 17, 2021

(86) PCT No.: PCT/JP2021/042244
§ 371 (c)(1),
(2) Date: May 19, 2023

(87) PCT Pub. No.: WO2022/113848
PCT Pub. Date: Jun. 2, 2022

(65) Prior Publication Data
US 2024/0014839 A1 Jan. 11, 2024

(30) Foreign Application Priority Data
Nov. 30, 2020 (JP) ................................. 2020-198931

(51) Int. Cl.
| *H04B 1/12* | (2006.01) |
| *H03D 7/12* | (2006.01) |
| *H04B 1/16* | (2006.01) |

(52) U.S. Cl.
CPC ................. *H04B 1/12* (2013.01); *H03D 7/12* (2013.01); *H04B 1/16* (2013.01)

(58) Field of Classification Search
CPC ... H04B 1/12; H04B 1/16; H04B 1/30; H04B 1/10; H04L 27/3863; H04L 27/34;
(Continued)

(56) References Cited

U.S. PATENT DOCUMENTS

| 6,959,179 B1 * | 10/2005 | Wong ........................ | H04B 1/30 |
| | | | 455/334 |
| 7,269,404 B2 * | 9/2007 | Yoneu ...................... | H04B 1/30 |
| | | | 455/115.2 |

(Continued)

FOREIGN PATENT DOCUMENTS

| JP | 2003-198262 A | 7/2003 |
| JP | 2013-185945 A | 9/2013 |
| JP | 2014-192783 A | 10/2014 |

OTHER PUBLICATIONS

JP 2014-192783 "Kenta" english translation, 2014.*

(Continued)

*Primary Examiner* — Lester G Kincaid
(74) *Attorney, Agent, or Firm* — CHIP LAW GROUP

(57) ABSTRACT

Provided is a reception apparatus that includes an in-phase-side mixer that mixes a high-frequency component and an in-phase-side local signal, and outputs the mixed signal as an in-phase-side mixed signal, a quadrature-side mixer that mixes the high-frequency component and a quadrature-side local signal orthogonal to the in-phase-side local signal, and outputs the mixed signal as a quadrature-side mixed signal, an error detection signal generation unit that generates four-phase detection signals having same frequencies as frequencies of the in-phase-side local signal and quadrature-side local signal, and each having a different phase, and a signal processing unit that generates a gain difference between an in-phase-side signal according to the in-phase-side mixed signal and a quadrature-side signal according to the quadrature-side mixed signal, on the basis of respective output signals of the in-phase-side mixer and quadrature-side mixer in a case where each of the four-phase detection signals is the high-frequency component.

16 Claims, 9 Drawing Sheets

(58) Field of Classification Search
CPC ......... H04L 27/38; H04L 27/14; H04L 27/22;
H03D 3/009; H03D 3/007; H03D 3/002;
H03D 7/12; H03D 7/165; H03D
2200/0086; H03D 2200/009; H03D
1/2245
See application file for complete search history.

(56) References Cited

U.S. PATENT DOCUMENTS

| | | | | |
|---|---|---|---|---|
| 8,064,863 B1 * | 11/2011 | Reed | ....................... | H04B 1/30 |
| | | | | 455/67.11 |
| 8,396,173 B2 * | 3/2013 | Ling | ................... | H04L 27/0014 |
| | | | | 375/343 |
| 2007/0080835 A1 * | 4/2007 | Maeda | ................... | H03D 3/009 |
| | | | | 341/120 |
| 2011/0189970 A1 * | 8/2011 | Ohshiro | ................... | H04B 1/10 |
| | | | | 455/302 |
| 2015/0200628 A1 * | 7/2015 | Rutten | ................ | H03D 7/1466 |
| | | | | 455/326 |

OTHER PUBLICATIONS

International Search Report and Written Opinion of PCT Application No. PCT/JP2021/042244, issued on Feb. 8, 2022, 08 pages of ISRWO.

* cited by examiner

Lo/0deg ADVANCE, 180deg DELAY

*FIG. 6*

Lo/0deg ADVANCE, 180deg DELAY

RECEPTION APPARATUS

CROSS REFERENCE TO RELATED APPLICATIONS

This application is a U.S. National Phase of International Patent Application No. PCT/JP2021/042244 filed on Nov. 17, 2021, which claims priority benefit of Japanese Patent Application No. JP 2020-198931 filed in the Japan Patent Office on Nov. 30, 2020. Each of the above-referenced applications is hereby incorporated herein by reference in its entirety.

TECHNICAL FIELD

The present disclosure relates to a reception apparatus.

BACKGROUND ART

For a radio-signal receiver, a direct conversion method of directly converting frequency of received signals into baseband signals without converting the frequency into intermediate frequency is widely used. In this direct conversion method, in order to suppress an image frequency signal, quadrature demodulation is performed by a quadrature mixer using local signals, in which an in-phase (I) signal and a quadrature (Q) signal are generated. It is important to reject the image frequency signal to improve anti-interference characteristics.

CITATION LIST

Patent Document

Patent Document 1: Japanese Patent Application Laid-Open No. 2003-198262

SUMMARY OF THE INVENTION

Problems to be Solved by the Invention

However, an image response rejection ratio (IMRR) may be reduced due to shifted amplitudes of an I signal and Q signal.

The present disclosure provides a reception apparatus capable of equalizing amplitudes of an I signal and a Q signal.

Solutions to Problems

According to an embodiment, a reception apparatus may include
an in-phase-side mixer that mixes a predetermined high-frequency component and an in-phase-side local signal, and outputs the mixed signal as an in-phase-side mixed signal,
a quadrature-side mixer that mixes the predetermined high-frequency component and a quadrature-side local signal orthogonal to the in-phase-side local signal, and outputs the mixed signal as a quadrature-side mixed signal,
an error detection signal generation unit that generates four-phase detection signals having same frequencies as frequencies of the in-phase-side local signal and quadrature-side local signal, and each having a different phase, and a signal processing unit that generates a gain difference between an in-phase-side signal according to the in-phase-side mixed signal and a quadrature-side signal according to the quadrature-side mixed signal, on the basis of respective output signals of the in-phase-side mixer and quadrature-side mixer in a case where each of the four-phase detection signals, each having a different phase, is the predetermined high-frequency component.

The reception apparatus may further include a switching unit that outputs, at a time of reception, an RF signal as the predetermined high-frequency component to the in-phase-side mixer and the quadrature-side mixer, and outputs, at a time of adjustment, each of the four-phase detection signals, each having a different phase, as the predetermined high-frequency component to the in-phase-side mixer and the quadrature-side mixer.

The four-phase detection signals may include a first detection signal having a first phase, a second detection signal having a phase different from the phase of the first detection signal in a range of 80 degrees to 100 degrees, a third detection signal having a phase different from the phases of the first detection signal and second detection signal, and a fourth detection signal having a phase different from the phases of the first detection signal and second detection signal and having a phase different from the phase of the third detection signal in a range of 80 degrees to 110 degrees.

The four-phase detection signals may include a first detection signal having a first phase, a second detection signal having a phase different from the phase of the first detection signal by 90 degrees, a third detection signal having a phase different from the phases of the first detection signal and second detection signal, and a fourth detection signal having a phase different from the phases of the first detection signal and second detection signal and having a phase different from the phase of the third detection signal by 90 degrees.

The reception apparatus may further include
an in-phase-side filter circuit that selectively passes the predetermined high-frequency component in a signal based on the in-phase-side mixed signal, and
a quadrature-side filter circuit that selectively passes the predetermined high-frequency component in a signal based on the quadrature-side mixed signal.

The signal processing unit may generate the gain difference on the basis of multiplication of
a first ratio of a magnitude of a first in-phase-side signal based on a first in-phase output signal output from the in-phase-side filter circuit on the basis of the first detection signal and a third in-phase output signal output from the in-phase-side filter circuit on the basis of the third detection signal to a magnitude of a first quadrature-side signal based on a first quadrature output signal output from the quadrature-side filter circuit on the basis of the first detection signal and a third quadrature output signal output from the quadrature-side filter circuit on the basis of the third detection signal by
a second ratio of a magnitude of a second in-phase-side signal based on a second in-phase output signal output from the in-phase-side filter circuit on the basis of the second detection signal and a fourth in-phase output signal output from the in-phase-side filter circuit on the basis of the fourth detection signal to a magnitude of a first quadrature-side signal based on a first quadrature output signal output from the quadrature-side filter circuit on the basis of the first detection signal and a third quadrature output signal output from the quadrature-side filter circuit on the basis of the third detection signal.

The reception apparatus may further include an in-phase-side current-to-voltage conversion unit that performs current-to-voltage conversion on the in-phase-side mixed signal and outputs the converted in-phase-side mixed signal to the in-phase-side filter circuit, and an in-phase-side current-to-voltage conversion unit that performs current-to-voltage conversion on the quadrature-side mixed signal and outputs the converted quadrature-side mixed signal to the quadrature-side filter circuit, in which gains of the in-phase-side current-to-voltage conversion unit and the in-phase-side current-to-voltage conversion unit may be adjusted on the basis of the gain difference.

The reception apparatus may further include a signal generation circuit that generates the in-phase-side local signal and the quadrature-side local signal on the basis of a first signal and a second signal having a phase different from a phase of the first signal by 90 degrees, in which the error detection signal generation unit may generate the four-phase detection signals on the basis of the first signal and the second signal.

The signal generation circuit may generate the first signal having a duty cycle of 50 percent, the second signal, a third signal that is an inverted signal of the first signal, a fourth signal that is an inverted signal of the second signal, and generates the in-phase-side local signal and the quadrature-side local signal on the basis of the first signal, second signal, third signal, and fourth signal.

The signal generation circuit may include a conversion circuit that converts a reference signal having a first frequency into a second frequency signal having a frequency same as a frequency of the in-phase-side local signal, and a 90-degree phase conversion circuit that generates the second signal having a duty cycle of 50 percent and having a phase shifted by 90 degrees from the first signal having a duty cycle of 50 percent and being generated by the conversion circuit, and may generate the third signal that is an inverted signal of the first signal and the fourth signal that is an inverted signal of the second signal, and may generate the in-phase-side local signal and the quadrature-side local signal on the basis of the first signal, the second signal, the third signal, and the fourth signal.

The reception apparatus may further include a logical AND circuit that generates, by determining a logical AND of two signals among the first signal, the second signal, the third signal, and the fourth signal, a first local signal having a duty cycle of 25 percent, a second local signal having a phase different from a phase of the first local signal by 90 degrees, a third local signal having a phase different from the phase of the first local signal by 180 degrees, and a fourth local signal having a phase different from the phase of the first local signal by 270 degrees, in which the in-phase-side local signal may include a signal based on the first local signal and the third local signal, and the quadrature-side local signal includes a signal includes a signal based on the second local signal and the fourth local signal.

The error detection signal generation unit may include a first signal switch that selectively outputs either the first signal or the second signal, a phase converter that generates, on the basis of a signal output from the first signal switch, two signals having phases different from each other by 90 degrees, and a second signal switch that selectively outputs either one of the two signals output by the phase converter.

The reception apparatus may further include an AD conversion circuit that converts an output from each of the in-phase-side filter circuit and the quadrature-side filter circuit into a digital signal, in which the signal processing unit may generate the gain difference on the basis of an output from the AD conversion circuit.

The reception apparatus may further include a phase shifter that changes a phase of a signal of either an output based on the in-phase-side filter circuit, the output being output from the AD conversion circuit, or an output based on the quadrature-side filter circuit, the output being output from the AD conversion circuit, and an adder circuit that adds an output from the AD conversion circuit and an output from the phase shifter.

The phase shifter may change a phase of a signal by 90 degrees.

The detection signal generated by the error detection signal generation unit may include a double-sideband signal.

BRIEF DESCRIPTION OF DRAWINGS

FIG. 6 is a diagram illustrating local signals and local signals with shifted duty cycles.

MODES FOR CARRYING OUT THE INVENTION

Figure 1:
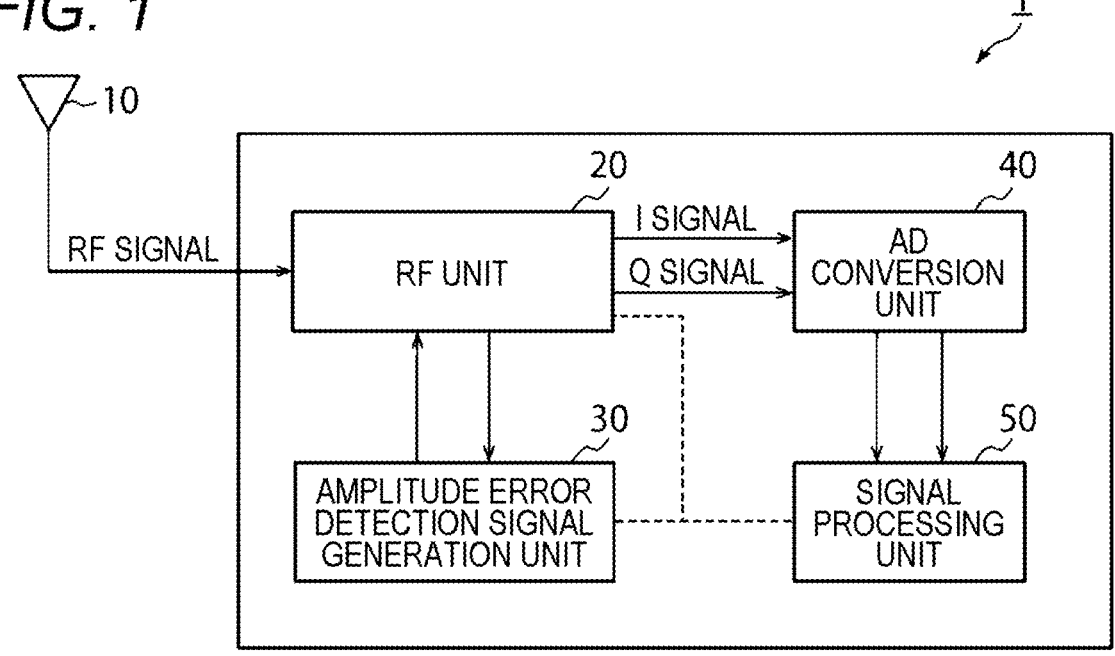
FIG. 1 is a schematic block diagram of a reception apparatus 1 according to a first embodiment.

Hereinafter, a reception apparatus according to some embodiments will be described with reference to the drawings. Note that, although power supply voltages Vss, Vdd, and the like are not particularly mentioned in the drawings and description, it is assumed that the power supply voltages are appropriately applied to respective circuit elements and the like.

First Embodiment

FIG. 1 is a schematic block diagram of a reception apparatus 1 according to a first embodiment. The reception apparatus 1 receives a radio frequency (RF) signal and demodulates the RF signal with a direct conversion method, and the reception apparatus 1 includes an antenna 10, an RF unit 20, an error detection signal generation unit 30, an analog to digital (AD) conversion unit 40, and a signal processing unit 50.

The antenna 10 converts an electromagnetic wave into an electric signal and supplies the electric signal as an RF signal to the RF unit 20 via a signal. The RF signal is a signal carrying a signal wave including an I signal and a Q signal. Furthermore, the RF signal is a differential voltage signal including a positive-side signal and a negative-side signal.

The RF unit 20 performs IQ demodulation on the RF signal to generate analog signal waves (I signal and Q signal). The RF unit 20 supplies the I signal and the Q signal to the AD conversion unit 40.

Before the RF unit 20 starts receiving the RF signal for example, the error detection signal generation unit 30 generates an amplitude error detection signal that detects an amplitude difference between the I signal and the Q signal. For example, the error detection signal generation unit 30 generates four-phase detection signals having the same frequencies as frequencies of the I signal and Q signal, and each having a different phase.

In general, in a case where IQ amplitude adjustment is performed by using an RF signal, it is conventionally necessary to use a single-sideband (SSB) signal as an RF test signal for a test. However, in a case where an SSB signal is used, a large-scale circuit and amplitude/phase adjustment similar to IMRR adjustment at reception are necessary to create the SSB signal. Therefore, from viewpoints of the adjustment method and the circuit scale for the SSB signal creation, a method in which the error detection signal generation unit 30 includes IC on chips and self-calibration is performed is not a practical method. Meanwhile, in a case where an input RF signal is a double-sideband (DSB) signal, if there is a phase difference between an RF input signal and a mixer local signal, an amplitude detection error greatly changes due to the phase difference, and an amplitude error between I and Q cannot be correctly detected. Therefore, although details will be described later, by using detection signals that are four-phase DSB signals, each having a different phase, the error detection signal generation unit 30 according to the present embodiment reduces an amplitude detection error due to a phase difference, and detects an amplitude error between the I signal and the Q signal. Note that, in the present embodiment, the amplitude error between the I signal and the Q signal may be referred to as an amplitude difference, an IQ gain difference, or a gain error.

The AD conversion unit 40 performs AD conversion on the I signal and the Q signal and supplies the AD-converted signals to the signal processing unit 50.

The signal processing unit 50 executes predetermined signal processing on the AD-converted I signal and Q signal. At a time of receiving the RF signal, the signal processing unit 50 performs processing of rejecting image frequency signals. Furthermore, at a time of calibration, the signal processing unit 50 executes processing of detecting an amplitude error between the I signal and the Q signal by using the four-phase detection signals, and adjusts the IQ gain difference.

Figure 2:
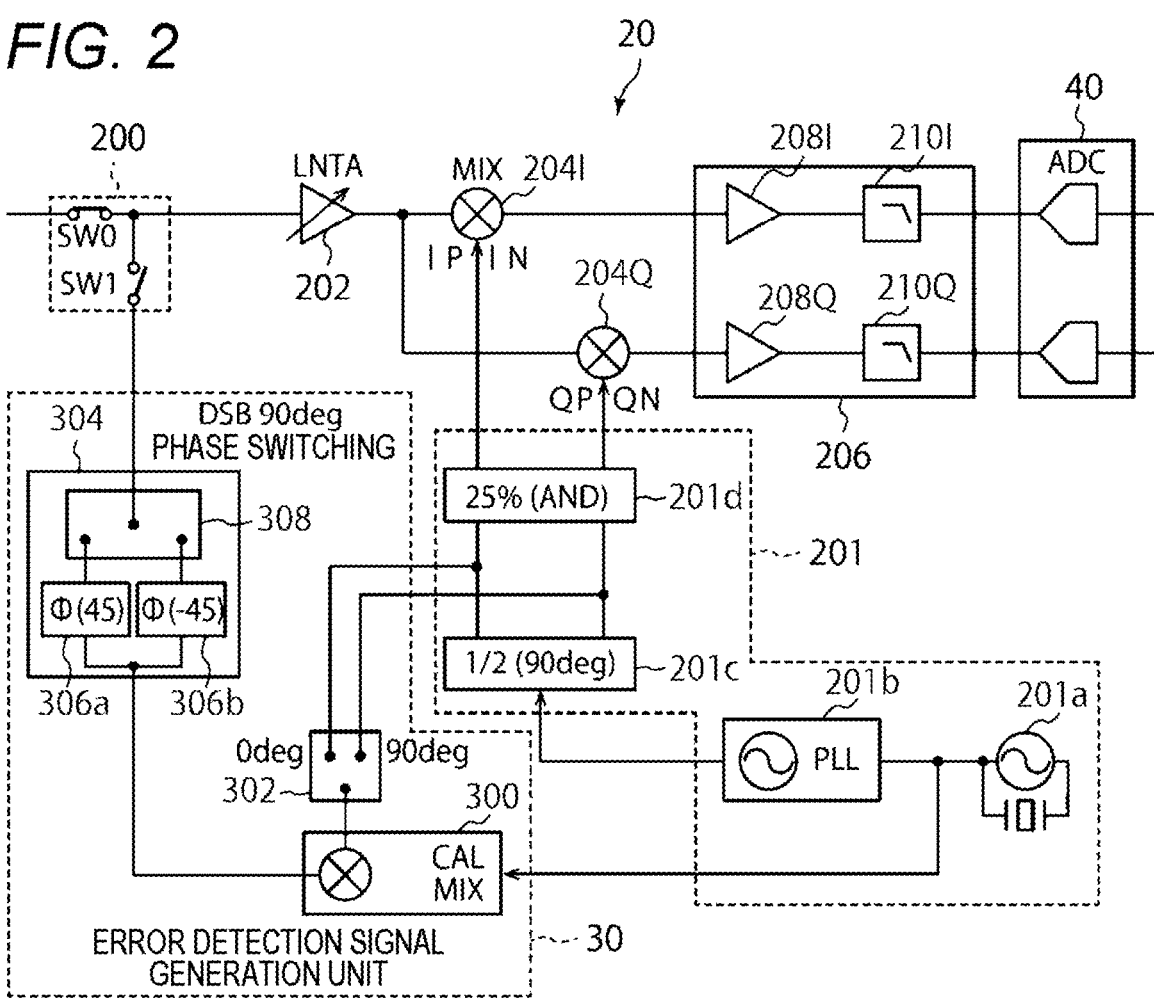
FIG. 2 is a block diagram illustrating a detailed configuration example of an RF unit and an amplitude error detection signal generation unit.

FIG. 2 is a block diagram illustrating a detailed configuration example of the RF unit 20 and the error detection signal generation unit 30. As illustrated in FIG. 2, the RF unit 20 includes a first signal switch 200, a signal generation circuit 201, a low-noise transconductance amplifier (LNTA) 202, an in-phase-side mixer 204I, a quadrature-side mixer 204Q, and an amplifier/smoother 206.

The first signal switch 200 switches between an RF signal and an amplitude error detection signal under control of the signal processing unit 50. The first signal switch 200 includes switching elements SW0 and SW1. More specifically, in a case where the RF signal is received, the switching element SW0 is brought into a conductive state, and the switching element SW1 is brought into a non-conductive state. Meanwhile, in a case where an amplitude is calibrated, the switching element SW0 is brought into a non-conductive state, and the switching element SW1 is brought into a conductive state.

Figure 3:
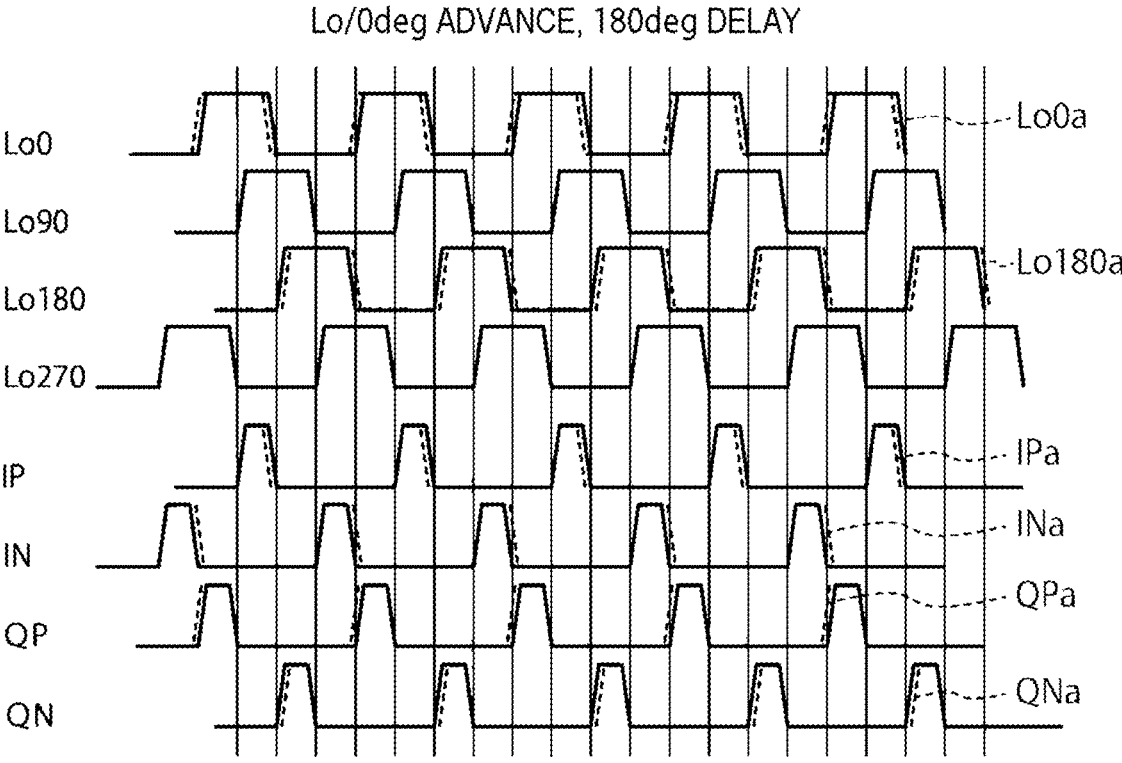
FIG. 3 is a diagram illustrating an example of signals generated by a signal generation circuit.

FIG. 3 is a diagram illustrating an example of signals generated by the signal generation circuit 201. Illustrated are, from the top, a first signal LO0, a second signal LO90 orthogonal to the first signal LO0, a third signal LO180 that is an inverted signal of the first signal LO0, a fourth signal LO270 that is an inverted signal of the second signal LO90, and four-phase local signals IP, IN, QP, and QN. The vertical axis represents a magnitude of a signal, and the horizontal axis represents time. A duty cycle of the first signal LO0, the second signal LO90, the third signal LO180, and the fourth signal LO270 is 50 percent. Meanwhile, a duty cycle of the four-phase local signals IP, IN, QP, and QN is 25 percent. For example, values on a high-intensity side of the four-phase local signals IP, IN, QP, and QN represent an ON state of drive signals in the in-phase-side mixer 204I and quadrature-side mixer 204Q to be described later, and values on a low-intensity side of the four-phase local signals IP, IN, QP, and QN represent an OFF state of the drive signals.

Furthermore, the first signal LO0$a$ represents a signal with a phase more advanced temporally than a phase of the first signal LO0, and the third signal LO180$a$ represents a signal with a phase more delayed temporally than a phase of the third signal LO180. Furthermore, as will be described later, the four-phase local signals IPa, INa, QPa, and QNa are four-phase local signals generated on the basis of the first signal LO0$a$, the second signal LO90, the third signal LO180$a$, and the fourth signal LO270, respectively, and have duty cycles shifted from 25 percent. When the duty cycles are shifted from 25 percent, gains (amplitudes) of the I signal and the Q signal are shifted from each other. When gains (amplitudes) of a signal and the Q signal are shifted from each other, an image response rejection ratio (IMRR) increases.

Here, a configuration of the signal generation circuit 201 will be described with reference to FIGS. 2 and 3. The signal generation circuit 201 is a circuit that generates the four-phase local signals IP, IN, QP, and QN, and includes a reference signal transmitter 201$a$, a PLL synthesizer 201$b$, a 90-degree phase-shift converter 201$c$, and a logical AND circuit (AND circuit) 201$d$.

The reference signal transmitter 201$a$ is, for example, a variable frequency oscillation circuit (VFO), and is a circuit in which a capacitor for an LC oscillator is a variable capacitor. The reference signal transmitter 201$a$ generates a reference signal having a frequency $\omega_0$, for example.

The PLL synthesizer 201$b$ is a circuit capable of changing the frequency $\omega_0$ of the reference signal, for example, by changing a frequency division number. The PLL synthesizer 201$b$ generates a first signal LO0 having a duty cycle of 50 percent and a frequency $\omega_L$, for example.

The 90-degree phase-shift converter 201$c$ generates a first signal LO0 and a second signal LO90 having phases different from each other by 90 degrees. That is, the 90-degree phase-shift converter 201$c$ generates the first signal LO0 and the second signal LO90 orthogonal to the first signal LO0. Then, the 90-degree phase-shift converter 201$c$ generates the third signal LO180 that is the inverted signal of the first signal LO0 and the fourth signal LO270 that is the inverted signal of the second signal LO90.

The logical AND circuit (AND circuit) 201$d$ includes a logical AND circuit. The logical AND circuit 201$d$ generates an IP signal having a duty cycle of 25 percent with a logical AND of the first signal LO0 and the second signal LO90. Similarly, a logical AND circuit generates an IN signal having a duty cycle of 25 percent with a logical AND of the third signal LO180 and the fourth signal LO270.

Similarly, the logical AND circuit 201$d$ generates a QP signal having a duty cycle of 25 percent with a logical AND of the first signal LO0 and the fourth signal LO270. Similarly, the logical AND circuit 201$d$ generates a QN signal having a duty cycle of 25 percent with a logical AND of the second signal LO90 and the third signal LO180. Thus, the duty cycle of the first signal LO0, the second signal LO90, the third signal LO180, and the fourth signal LO270 is 50 percent. Meanwhile, a duty cycle of the local signals IP, IN, QP, and QN, which are output signals from the logical AND circuit 201$d$, is 25 percent. In a case where there is no phase error in the first signal LO0, the second signal LO90, the third signal LO180, and the fourth signal LO270, the local signals IP, IN, QP, and QN having a duty cycle of 25 percent are generated as described above. Note that the first signal LO0$a$, the third signal LO180$a$, and the local signals IP$a$, IN$a$, QP$a$, and QN$a$ in a case where a phase error occurs in the first signal LO0, the second signal LO90, the third signal LO180, and the fourth signal LO270 will be described later with reference to FIG. 6.

The low-noise transconductance amplifier (LNTA) 202 converts a differential signal supplied from the first signal switch 200 into a differential current signal, amplifies the differential current signal, and supplies the differential current signal to the in-phase-side mixer 204I and the quadrature-side mixer 204Q. In a case where the local signals IP, IN, QP, and QN having a duty cycle of 25 percent are used, the low-noise transconductance amplifier 202 with low power consumption can be shared on an in-phase side and a quadrature side, and an error between I and Q in the low-noise transconductance amplifier 202 can be eliminated.

Figure 4:
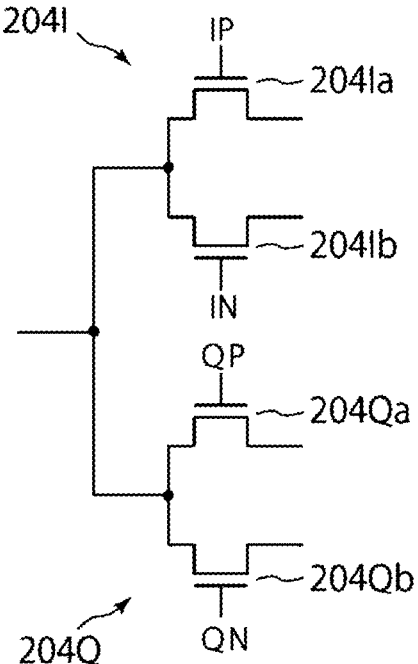
FIG. 4 is a diagram illustrating a configuration example of an in-phase-side mixer and a quadrature-side mixer.

Here, configurations of the in-phase-side mixer 204I and quadrature-side mixer 204Q will be described with reference to FIGS. 2 and 4. FIG. 4 is a diagram illustrating a configuration example of the in-phase-side mixer 204I and the quadrature-side mixer 204Q. The in-phase-side mixer 204I includes a switch 204I$a$ and a switch 204I$b$, and the quadrature-side mixer 204Q includes a switch 204Q$a$ and a switch 204Q$b$. Each switch includes, for example, an n-type metal-oxide-semiconductor field-effect transistor (MOSFET), for example. The IP signal is applied to a gate (drive terminal) of the switch 204I$a$, the IN signal is applied to a gate of the switch 204I$b$, the QP signal is applied to a gate of the switch 204Q$a$, and the QN signal is applied to a gate of the switch 204Q$b$.

With this arrangement, the in-phase-side mixer 204I mixes the RF signal with the IP signal and IN signal generated by the signal generation circuit 201. Similarly, the Quadrature-side mixer 204Q mixes the RF signal with the QP signal and QN signal generated by the signal generation circuit 201.

Figure 5:
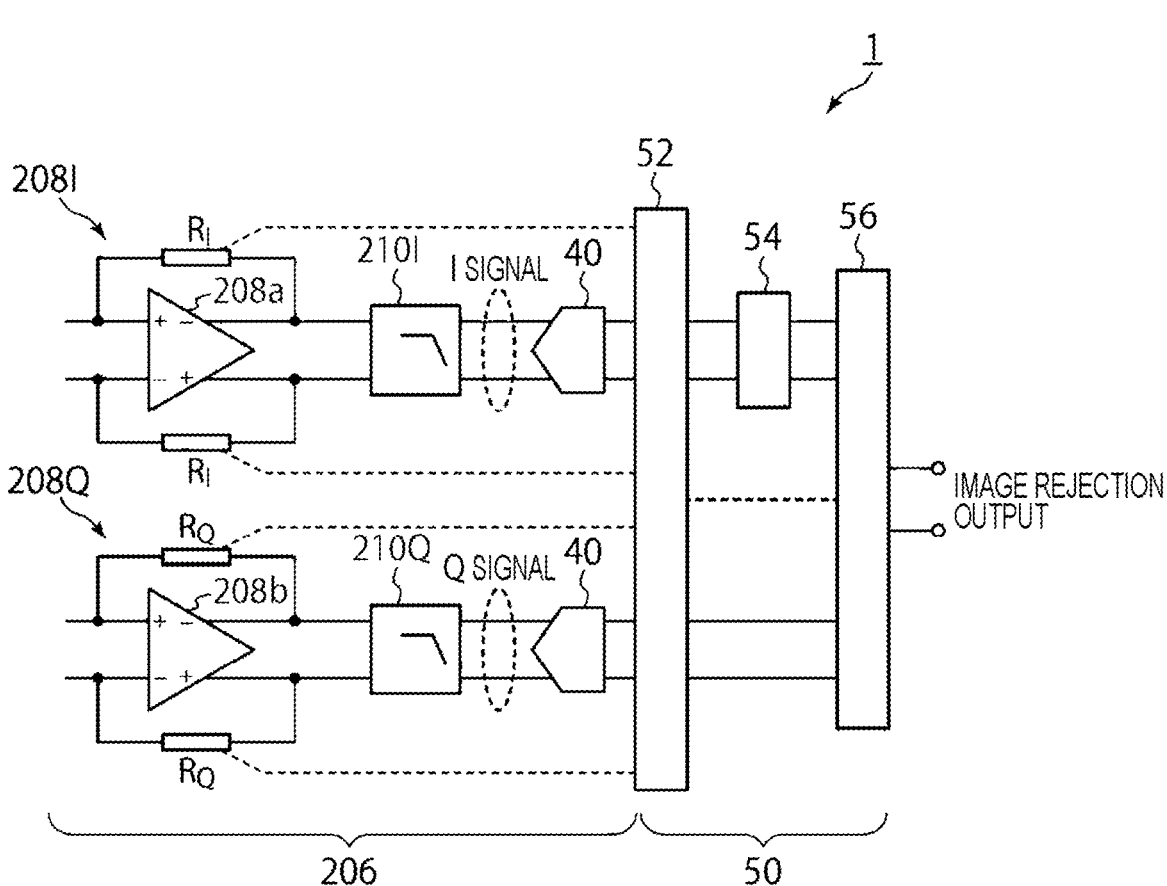
FIG. 5 is a diagram illustrating a configuration example of an amplifier/smoother and a signal processing unit.

Here, a configuration of the amplifier/smoother 206 will be described with reference to FIGS. 2 and 5. FIG. 5 is a diagram illustrating a configuration example of the amplifier/smoother 206 and the signal processing unit 50. A configuration of the signal processing unit 50 will be described later.

The amplifier/smoother 206 includes an in-phase-side current-to-voltage conversion unit 208I, a quadrature-side current-to-voltage conversion unit 208Q, an in-phase-side filter circuit 210I, and a quadrature-side filter circuit 210Q.

The in-phase-side current-to-voltage conversion unit 208I performs current-to-voltage conversion on in-phase-side mixed signals output from the in-phase-side mixer 204I, and outputs the converted voltage signals to the in-phase-side filter circuit 210I as I signals. The in-phase-side current-to-voltage conversion unit 208I includes a plurality of first resistors RI and a trans-impedance amplifier (TIA) 208$a$.

The TIA 208$a$ is an amplifier that converts current into voltage, and includes a non-inverting input terminal, an inverting input terminal, a non-inverting output terminal, and an inverting output terminal. A positive-side signal among the in-phase-side mixed signals is input to the non-inverting input terminal of the TIA 208$a$, and a negative-side signal among the in-phase-side mixed signals is input to the inverting input terminal. Furthermore, the TIA 208$a$ is fed back from the inverting output terminal to the non-inverting input terminal via a resistor having a first resistance value $R_I$, the resistor controlling a gain, and is fed back from the non-inverting output terminal to the inverting input terminal via a resistor having a first resistance value $R_I$, the resistor controlling a gain.

The quadrature-side current-to-voltage conversion unit 208Q performs current-to-voltage conversion on quadrature-side mixed signals output from the quadrature-side mixer 204Q, and outputs the converted voltage signals to the quadrature-side filter circuit 210Q as Q signals. The quadrature-side current-to-voltage conversion unit 208Q includes a plurality of second resistors $R_Q$ and a trans-impedance amplifier (TIA) 208$b$.

The TIA 208$b$ is an amplifier that converts current into voltage, and includes a non-inverting input terminal, an inverting input terminal, a non-inverting output terminal, and an inverting output terminal. A positive-side signal among the quadrature-side mixed signals is input to the non-inverting input terminal of the TIA 208$b$, and a negative-side signal among the quadrature-side mixed signals is input to the inverting input terminal of the TIA 208$b$. Furthermore, the TIA 208$b$ is fed back from the inverting output terminal to the non-inverting input terminal via a resistor having a second resistance value $R_Q$, the resistor controlling a gain, and is fed back from the non-inverting output terminal to the inverting input terminal via a resistor having a second resistance value $R_Q$, the resistor controlling a gain.

The in-phase-side filter circuit 210I selectively passes a predetermined frequency component of the I signals output from the in-phase-side current-to-voltage conversion unit 208I and supplies the frequency component to the AD conversion unit 40. That is, the in-phase-side filter circuit 210I has a low-pass characteristic, and can remove a predetermined high-frequency component.

Similarly, the quadrature-side filter circuit 210Q selectively passes a predetermined frequency component of the Q signals output from the quadrature-side current-to-voltage conversion unit 208Q and supplies the frequency component to the AD conversion unit 40. That is, the Quadrature-side filter circuit 210Q has a low-pass characteristic, and can remove a predetermined high-frequency component.

A configuration of the error detection signal generation unit 30 will be described with reference to FIG. 2 again. The error detection signal generation unit 30 includes a mixer 300, a second signal switch 302, and a phase-shift switch 304.

The mixer 300 mixes the reference signal generated by the reference signal transmitter 201*a* and having the frequency ω₀, and an output signal from the second signal switch 302, and supplies the mixed signal to the phase-shift switch 304.

The second signal switch 302 switches between the first signal LO0 and the second signal LO90 having a phase different by 90 degrees, and supplies the switched signal to the mixer 300 as the output signal. With this arrangement, the mixer 300 outputs a first mixed signal LM0 of the first signal LO0 having the frequency ω_L and the reference signal having the frequency ω₀, or a second mixed signal LM90 of the second signal LO90 having the frequency ω_L and the reference signal having the frequency ω₀.

The phase-shift switch 304 adjusts phases of the first mixed signal LM0 and second mixed signal LM90 under control of the signal processing unit 50, generates a signal having a phase difference of 90 degrees, and supplies the signal to the low-noise transconductance amplifier 202 via the first signal switch 200. That is, the phase-shift switch 304 includes phase-shift converters 306*a*, 306*b* and a third signal switch 308.

The phase-shift converter 306*a* generates a first amplitude error detection signal LM0(45) obtained by advancing a phase φ of the first mixed signal LM0 by 45 degrees. Meanwhile, the phase-shift converter 306*b* generates a second amplitude error detection signal LM0(−45) obtained by delaying the phase φ of the first mixed signal LM0 by 45 degrees.

Similarly, the phase-shift converter 306*a* generates a third amplitude error detection signal LM90(45) obtained by advancing a phase φ of the second mixed signal LM90 by 45 degrees. Meanwhile, the phase-shift converter 306*b* generates a fourth amplitude error detection signal LM90(−45) obtained by delaying the phase φ of the second mixed signal LM90 by 45 degrees.

The third signal switch 308 switches output signals of the phase-shift converter 306*a* and the phase-shift converter 306*b*, and supplies the switched signal to the low-noise transconductance amplifier 202 via the first signal switch 200. Thus, under control of the signal processing unit 50, the error detection signal generation unit 30 switches between the second signal switch 302 and the third signal switch 308 to output the four-phase amplitude error detection signals LM0(45), LM0(−45), LM90(45), and LM90(−45) that have the frequency ω_L. Note that, in the present embodiment, −45 degrees and 45 degrees are used for phase adjustment with phase difference of 90 degrees, but the present invention is not limited thereto. For example, a combination of 0 degrees and 90 degrees, a combination of −30 degrees and 60 degrees, a combination of −60 degrees and 30 degrees, or the like may be used. Furthermore, in the present embodiment, the phase difference is set to 90 degrees in order to simplify the description, but the present invention is not limited thereto. As will be described later, the phase difference is only required to be in a range in which the gain error can be adjusted, and may be, for example, in a range of 75 degrees to 115 degrees.

Here, a configuration of the signal processing unit 50 will be described with reference to FIGS. 2 and 6 again. The signal processing unit 50 includes, for example, a CPU, and includes an error detection circuit 52, a phase shifter 54, and an adder circuit 56. Furthermore, as described above, the signal processing unit 50 controls the first signal switch 200, the first resistance value R_I of the TIA 208*b*, the second resistance value R_Q of the TIA 208*b*, the second signal switch 302, and the third signal switch 308.

The signal processing unit 50 outputs a signal obtained by rejecting an image from an input digital signal. The error detection circuit 52 detects an IQ gain difference in an amplitude error detection digital signal that is input at a time of calibration. Moreover, after the detection, on the basis of a detected value, the first resistance value R_I and second resistance value R_Q, which are for gain adjustment and included in the in-phase-side current-to-voltage conversion unit 208I and the quadrature-side current-to-voltage conversion unit 208Q, respectively, are updated so that the IQ gain difference approaches 0. Details of the error detection circuit 52 will be described later.

The phase shifter 54 shifts a phase of an I signal by +90 degrees, for example. Thus, the phase shifter 54 performs phase-shift processing on any of the signals. Although the phase shifter 54 is provided on the in-phase side (I signal side) in FIG. 6, the phase shifter 54 may be provided on the quadrature side (Q signal side).

The adder circuit 56 adds an output of the I signals via the phase shifter 54 and the Q signals. When either an I signal or a Q signal is shifted by 90 degrees and added, a desired signal is added in phase, whereas the image component is added in opposite phase. Therefore, it is possible to acquire a signal from which an image component has been rejected. Thus, a signal with a reduced image response rejection ratio (IMRR) can be obtained by adding the output of the I signals via the phase shifter 54 and the Q signals.

[Phase Shift and Duty Cycle]

Figure 6:
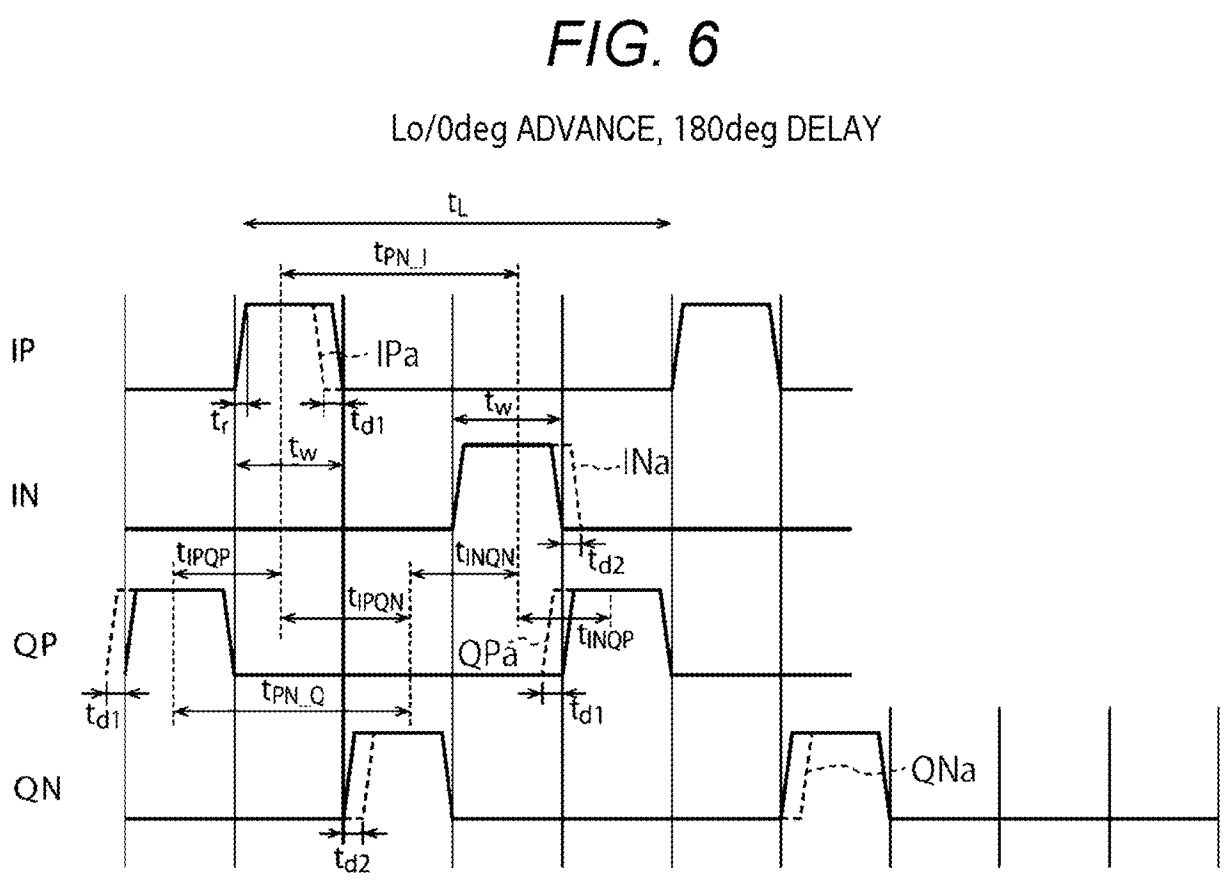

Phase shifts and duty cycles in the reception apparatus 1 will be described by using reference to FIG. 6 with reference to FIG. 3. FIG. 6 is a diagram illustrating the local signals IP, IN, QP, and QN, and the local signals IPa, INa, QPa, and QNa with shifted duty cycles that are illustrated in FIG. 3. As illustrated in FIG. 3, the local signals IPa, INa, QPa, and QNa are signals generated by the logical AND circuit (AND circuit) 201*d* performing logical conjunction processing using the first signal LO0*a* with a phase more advanced than the phase of the first signal LO0, the second signal LO90, the third signal LO180*a* with a phase more delayed than the phase of the third signal LO180, and the fourth signal LO270.

Here, a period of the local signal IPa is T_L, a phase advance of a first signal LO is t_{d1}, a phase delay of the third signal LO180 is t_{d2}, a ¼ period of the period T_L is t_w, a phase difference between the local signals IPa and INa is t_{pn_i}, a phase difference between the local signals QPa and QNa is t_{pn_Q}, a phase difference between the local signals QPa and IPa is t_{IPQP}, a phase difference between the local signals IPa and QNa is t_{IPQN}, a phase difference between the local signals QNa and INa is t_{INQN}, and a phase difference between the local signals INa and QPa is t_{INQP}. In this case, as can be seen from FIG. 6, the phase differences t_{pn_i} and t_{pn_Q} can be expressed by Mathematical Formula (1).

[Mathematical Formula 1]

$$t_{PN\_I} = \left( \frac{t_L}{2} + \frac{t_w + t_{d2}}{2} \right) - \frac{t_w - t_{d1}}{2} \qquad (1)$$

11

-continued $$t_{PN\_Q} = \left(\frac{t_L}{2} + \frac{t_w - t_{d2}}{2}\right) - \frac{t_w + t_{d1}}{2}$$

Furthermore, in a case of $t_{d1}=t_{d2}=t_d$, Mathematical Formula (1) is replaced by Mathematical Formula (2).

[Mathematical Formula 2]

$$t_{PN\_I} = \frac{t_L}{2} + t_d \quad (2)$$

$$t_{PN\_Q} = \frac{t_L}{2} - t_d$$

Similarly, in a case of $t_{d1}=t_{d2}=t_d$, the phase differences $t_{IPQN}$ and $t_{INQP}$ can be calculated as expressed by Mathematical Formula (3).

[Mathematical Formula 3]

$$t_{IPQN} = \left(\frac{t_L}{4} + t_{d2}\right) + \frac{t_w - t_{d2}}{2} - \frac{t_w - t_{d1}}{2} \quad (3)$$

$$= \frac{t_L}{4} + t_d$$

$$t_{INQP} = \frac{t_L}{4} - t_d$$

Similarly, in a case of $t_{d1}=t_{d2}=t_d$, the phase differences $t_{IPQP}$ and $t_{INQN}$ can be calculated as expressed by Mathematical Formula (4).

[Mathematical Formula 4]

$$t_{IPQP} = \frac{t_w - t_{d1}}{2} + \frac{t_w + t_{d1}}{2} = t_w = \frac{t_L}{4} \quad (4)$$

$$t_{INQN} = \frac{t_w - t_{d2}}{2} + \frac{t_w + t_{d2}}{2} = t_w = \frac{t_L}{4}$$

Thus, a phase difference between the local signals IPa and QPa is 90 degrees, and a phase difference between the local signals INa and QNa is 90 degrees. As can be seen from the above, in a case where any of the phases of the first signal LO0, the second signal LO90, the third signal LO180, and the fourth signal LO270 is shifted, a quadrature relation is maintained for the phases between the local signals IPa and QPa and for the phases between the local signals INa and QNa. Meanwhile, in the case where any of the phases of the first signal LO0, the second signal LO90, the third signal LO180, and the fourth signal LO270 is shifted, duty cycles of the local signals IPa, INa, QPa, and QNa are shifted. As described above, each of the shifts in the duty cycles of the local signals IPa, INa, QPa, and QNa is a gain difference between the I signal and the Q signal.

Thus, a phase difference between the local signals IPa and QPa is 90 degrees, and a phase difference between the local signals INa and QNa is 90 degrees. As can be seen from the above, in a case where any of the phases of the first signal LO0, the second signal LO90, the third signal LO180, and the fourth signal LO270 is shifted, a quadrature relation is maintained for the phases between the local signals IPa and QPa and for the phases between the local signals INa and QNa. Meanwhile, in the case where any of the phases of the first signal LO0, the second signal LO90, the third signal LO180, and the fourth signal LO270 is shifted, duty cycles of the local signals IPa, INa, QPa, and QNa are shifted. As described above, each of the shifts in the duty cycles of the local signals IPa, INa, QPa, and QNa is a gain difference between the I signal and the Q signal.

[Detection of IQ Gain Difference]

Figure 7:
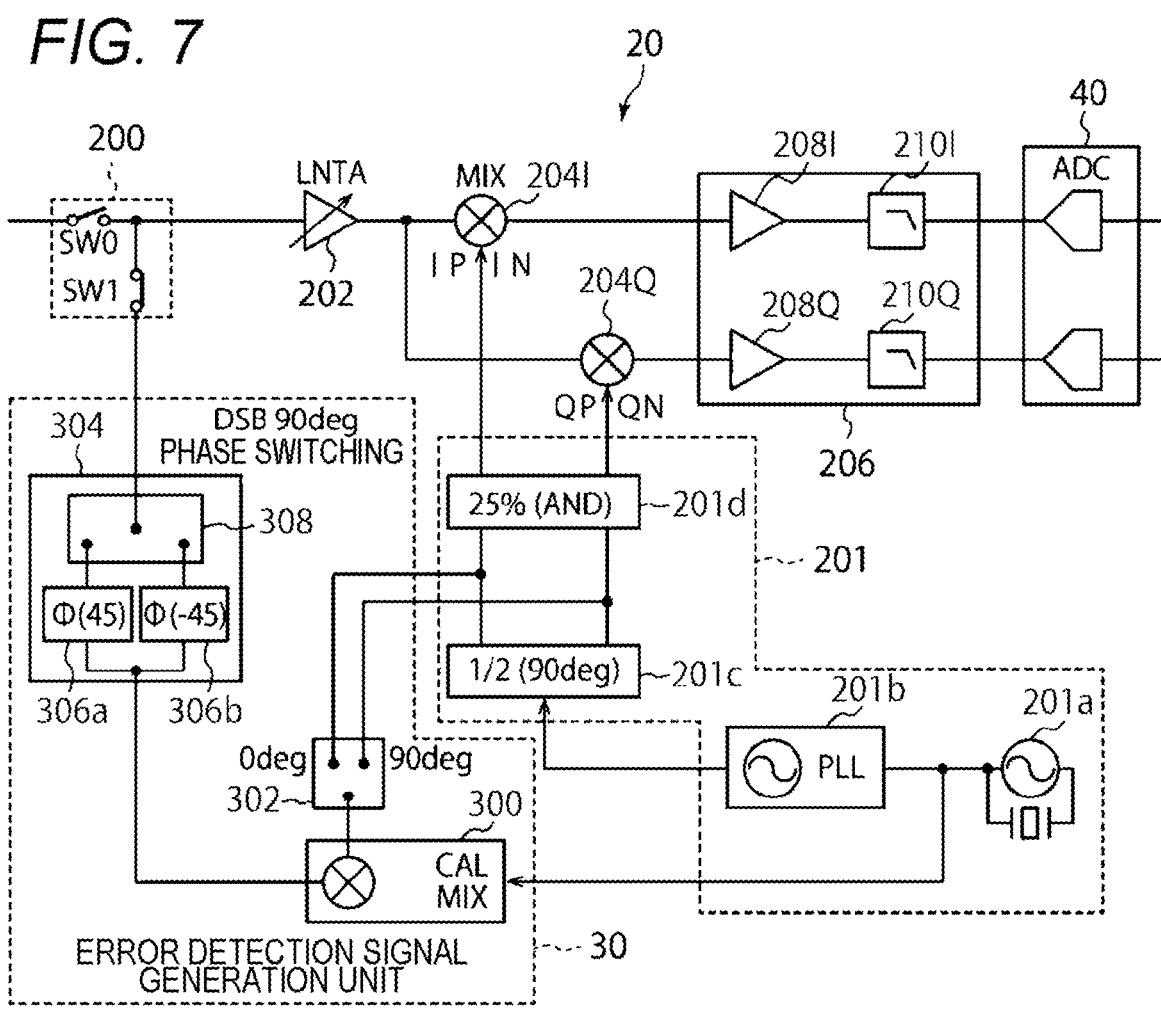
FIG. 7 is a diagram illustrating a state in a case where gain calibration is performed.

Detection of the IQ gain difference by the error detection circuit 52 (refer to FIG. 5) will be described with reference to FIGS. 7 and 8. FIG. 7 is a diagram illustrating a state in a case where gain calibration is performed. That is, FIG. 7 is a diagram illustrating a state in a case where, in the first signal switch 200, the switching element SW0 is brought into the non-conductive state, the switching element SW1 is brought into the conductive state, and detection of the IQ gain difference is performed.

Because the low-noise transconductance amplifier 202 (FIG. 2) is common to an in-phase-side signal (I signal side) and a quadrature-side signal (Q signal side), description thereof is omitted. Furthermore, amplification factors of the in-phase-side current-to-voltage conversion unit 208I and the quadrature-side current-to-voltage conversion unit 208Q are the same at a time of calibration, and thus description thereof is omitted.

Figure 8:
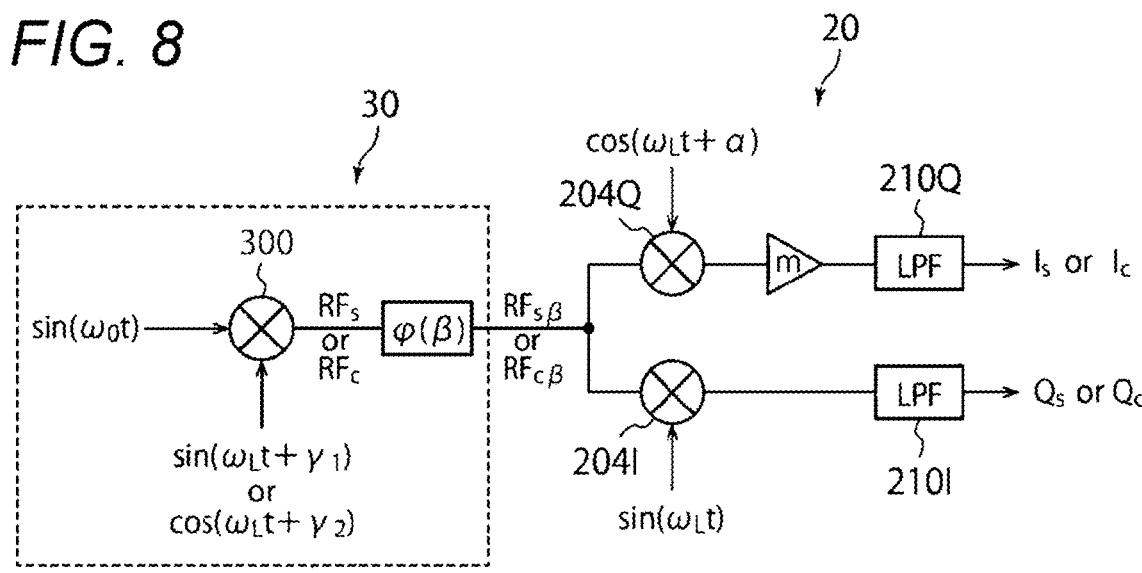
FIG. 8 is a diagram illustrating states of circuits and signals in FIG. 7 in a simplified manner.

FIG. 8 is a diagram illustrating states of the circuits and signals in FIG. 7. The reference signal generated by the reference signal transmitter 201a (refer to FIG. 2) is expressed by $\sin(\omega_0 t)$, the amplitude error detection signal LM0(45) obtained by the phase-shift converter 306a shifting a phase of the first signal LO0 generated by the 90-degree phase-shift converter 201c is expressed by $\sin(\omega_L t + \gamma_1)$, and the amplitude error detection signal LM90(45) obtained by the phase-shift converter 306a shifting a phase of the second signal LO90 is expressed by $\cos(\omega_L t + \gamma_2)$. Here, $\gamma_1$ and $\gamma_2$ are phases. Furthermore, an input signal to the in-phase-side mixer 204I generated by the signal generation circuit 201 is expressed by $\cos(\omega_L t + \alpha)$, and an input signal to the quadrature-side mixer 204Q is expressed by $\sin(\omega_L t)$. m is a gain difference and $\alpha$ is a phase.

A phase shift from a signal output from the error detection signal generation unit 30 is expressed by $\varphi$ ($\beta$). Here, in order to simplify the description, $\varphi(\beta)$ is simply described as $\beta$.

Furthermore, a mixed signal of the reference signal $\sin(\omega_0 t)$ and the signal $\sin(\omega_L t + \gamma_1)$ in the mixer 300 is defined as RFs, and a signal obtained by shifting a phase of RFs by $\beta$ is defined as RFs$\beta$. A signal obtained by mixing the signal RFs$\beta$ and the input signal $\cos(\omega_L t + \alpha)$ by using the in-phase-side mixer 204I, and by having a low-frequency side passing the in-phase-side filter circuit 210I is defined as Is. Similarly, a signal obtained by mixing the signal RFs and the input signal $\sin(\omega_L t)$ by using the quadrature-side mixer 204Q, and by having a low-frequency side passing the quadrature-side filter circuit 210Q is defined as Qs.

Furthermore, a mixed signal of the reference signal $\sin(\omega_0 t)$ and the signal $\cos(\omega_L t + \gamma_2)$ in the mixer 300 is defined as RFc, and a signal obtained by shifting a phase of RFc by $\beta$ is defined as RFc$\beta$. A signal obtained by mixing the signal RFc$\beta$ and the input signal $\cos(\omega_L t + \alpha)$ by using the in-phase-side mixer 204I, and by having a low-frequency side passing the in-phase-side filter circuit 210I is defined as Ic. Similarly, a signal obtained by mixing the signal RFc$\beta$, and the input signal $\sin(\omega_L t)$ by using the quadrature-side mixer 204Q, and by having a low-frequency side passing the quadrature-side filter circuit 210Q is defined as Qc.

<Case of $\sin(\omega_L t + \gamma_1)$>

The mixed signal RFs is expressed by Mathematical Formula (5), and the signal RFs$\beta$ obtained by shifting the phase of RFs by $\beta$ is expressed by Formula (6).

[Mathematical Formula 5]

$$RF_s = \frac{1}{2j}\left(e^{j\omega_0 t} - e^{-j\omega_0 t}\right)\frac{1}{2f}\left(e^{j(\omega_L t + \gamma_1)} - e^{-j(\omega_L t + \gamma_1)}\right) \quad (5)$$

[Mathematical Formula 6]

$$RF_{s\beta} = -\frac{1}{2}\left\{\frac{e^{j(\omega_L t+\gamma_3+\omega_O t+\beta)} + e^{-j(\omega_L t+\gamma_3+\omega_O t+\beta)}}{2} - \frac{e^{j(\omega_L t+\gamma_3+\omega_O t+\beta)} + e^{-j(\omega_L t+\gamma_3+\omega_O t+\beta)}}{2}\right\} \quad (6)$$

Then, Qs/m is expressed by Mathematical Formula (7). LPF in Mathematical Formula (7) means a signal obtained by having a low-frequency side passing the quadrature-side filter circuit 210Q.

[Mathematical Formula 7]

$$\frac{Q_s}{m} = RF_{op} + \frac{1}{2}\left(e^{j(\omega_O t+\alpha)} + e^{-j(\omega_O t+\alpha)}\right) \stackrel{LPt}{\cong}$$

$$\left\{\frac{e^{j(\omega_L t+\gamma_3+\omega_O t+\beta)} + e^{-j(\omega_L t+\gamma_3+\omega_O t+\beta)}}{2} - \right.$$

$$\left.\frac{e^{j(\omega_L t+\gamma_3+\omega_O t+\beta)} + e^{-j(\omega_L t+\gamma_3+\omega_O t+\beta)}}{2}\right\}$$

$$\frac{Q_s}{m} = -\frac{1}{4}\left[\{\cos(\omega_O t + \gamma_1 - \alpha + \beta) - \cos(\omega_O t - \gamma_1 + \alpha - \beta)\}\right]$$

$$\frac{Q_s}{m} = \frac{1}{2}\{\sin(\omega_O t) + \sin(\gamma_1 - \alpha + \beta)\}$$

When similar conversion is performed, Is is expressed by Mathematical

[Mathematical Formula 8]

$$I_s = \frac{1}{2}(\sin(\omega_0 t) * \cos(\gamma_2 + \beta)) \quad (8)$$

<Case of $\cos(\omega_L t+\gamma_2)$>

In a case where the signal is switched and the reference signal $\sin(\omega_0 t)$ and the signal $\cos(\omega_L t+\gamma_2)$ are mixed in the mixer 300, Qc/m is expressed by Mathematical Formula (10) and Ic is expressed by Mathematical Formula (11) because a relation in Mathematical Formula (9) is established.

[Mathematical Formula 9]

$$\cos(\omega_L t + \gamma_2) = \sin\left(\omega_L t + \frac{\pi}{2} + \gamma_2\right) \quad (9)$$

[Mathematical Formula 10]

$$\frac{Q_c}{m} = \frac{1}{2}(\sin(\omega_0 t) * \cos(\gamma_2 - \alpha + \beta)) \quad (10)$$

[Mathematical Formula 11]

$$I_c = -\frac{1}{2}[\sin(\omega_0 t) * \sin(\gamma_2 + \beta)] \quad (11)$$

When amplitudes of Qs, Is, Qc, and Ic are Qsm, Ism, Qcm, and Icm, respectively, and $\gamma_1=\gamma$, $\gamma_2=\gamma+\Delta\gamma$, and $\gamma+\beta=\gamma\beta$, Qsm, Ism, Qcm, and Icm are expressed by Mathematical Formulas (12) to (15), respectively.

[Mathematical Formula 12]

$$Q_{sm} = \frac{m}{2}\sin(\gamma_\beta - \alpha) \quad (12)$$

[Mathematical Formula 13]

$$I_{sm} = \frac{1}{2}\cos(\gamma_\beta) \quad (13)$$

[Mathematical Formula 14]

$$Q_{cm} = \frac{m}{2}\cos(\gamma_\beta - \alpha + \Delta_\gamma) \quad (14)$$

[Mathematical Formula 15]

$$I_{cm} = -\frac{1}{2}\sin(\gamma_\beta + \Delta_\gamma) \quad (15)$$

Note that magnitudes of the Is signal and the Qs signal are calculated with IsQs combination, by adding the square of Is and the square of Qs and calculating a square root. Similarly, magnitudes of the Ic signal and the Qc signal are calculated with IcQc combination, by adding the square of Ic and the square of Qc and calculating a square root. However, what is desired to be known is a gain difference between the Is signal and the Qs signal. Therefore, a gain factor m1 is calculated by Mathematical Formula (16).

[Mathematical Formula 16]

$$m_1 = \frac{\sqrt{Q_{sm}^2 + Q_{cm}^2}}{\sqrt{I_{sm}^2 + I_{cm}^2}} = m * \frac{\sqrt{\sin^2(\gamma_\beta - \alpha) + \cos^2(\gamma_\beta - \alpha + \Delta_\gamma)}}{\sqrt{\cos^2(\gamma_\beta) + \sin^2(\gamma_\beta + \Delta_\gamma)}} \quad (16)$$

Similarly, the output signals are switched to a side close to the phase-shift converter 306b (refer to FIG. 2), and similar calculation is performed on the amplitude error detection signals LM0(−45) and LM90(−45). Because the phase difference between output signals of the phase-shift converter 306a and phase-shift converter 306b is 90 degrees, a gain factor m2 is calculated by Mathematical Formula (17). Then, as expressed by Mathematical Formula (18), a geometric mean of the factors m1 and m2 is a gain difference m. With this arrangement, it is possible to obtain an estimate value of the gain difference m for which an effect of an error due to a phase difference $\gamma\beta$ is reduced.

[Mathematical Formula 17]

$$m_2 = \frac{\sqrt{Q_{km}^2 + Q_{cm}^2}}{\sqrt{I_{km}^2 + I_{cm}^2}} = m * \frac{\sqrt{\cos^2(\gamma_\beta - \alpha) + \sin^2(\gamma_\beta - \alpha + \Delta_\gamma)}}{\sqrt{\sin^2(\gamma_\beta) + \cos^2(\gamma_\beta + \Delta_\gamma)}} \quad (17)$$

[Mathematical Formula 18]

$$m = \sqrt{m_1 m_2} \quad (18)$$

Thus, the error detection circuit 52 (refer to FIG. 5) controls the second signal switch 302 and the third signal switch 308 to switch signals, and calculates and detects the gain difference m according to Mathematical Formulas (16) to (18). Then, on the basis of a detected gain difference m, the error detection circuit 52 may adjust the first resistance value $R_I$ and second resistance value $R_Q$, which are for gain adjustment and included in the in-phase-side current-to-voltage conversion unit 208I and the quadrature-side current-to-voltage conversion unit 208Q, respectively, the ratio of $R_I/R_Q$, so that the gain difference is 1. That is, in the present embodiment, the error detection circuit 52 adjusts the first resistance value $R_I$ and the second resistance value $R_Q$ so that a gain on the quadrature side is multiplied by m times. Alternatively, the first resistance value $R_I$ and the second resistance value $R_Q$ may be adjusted so that the gain on the in-phase side is multiplied by 1/m times.

Figures 9A, 9B, 9C, 9D:
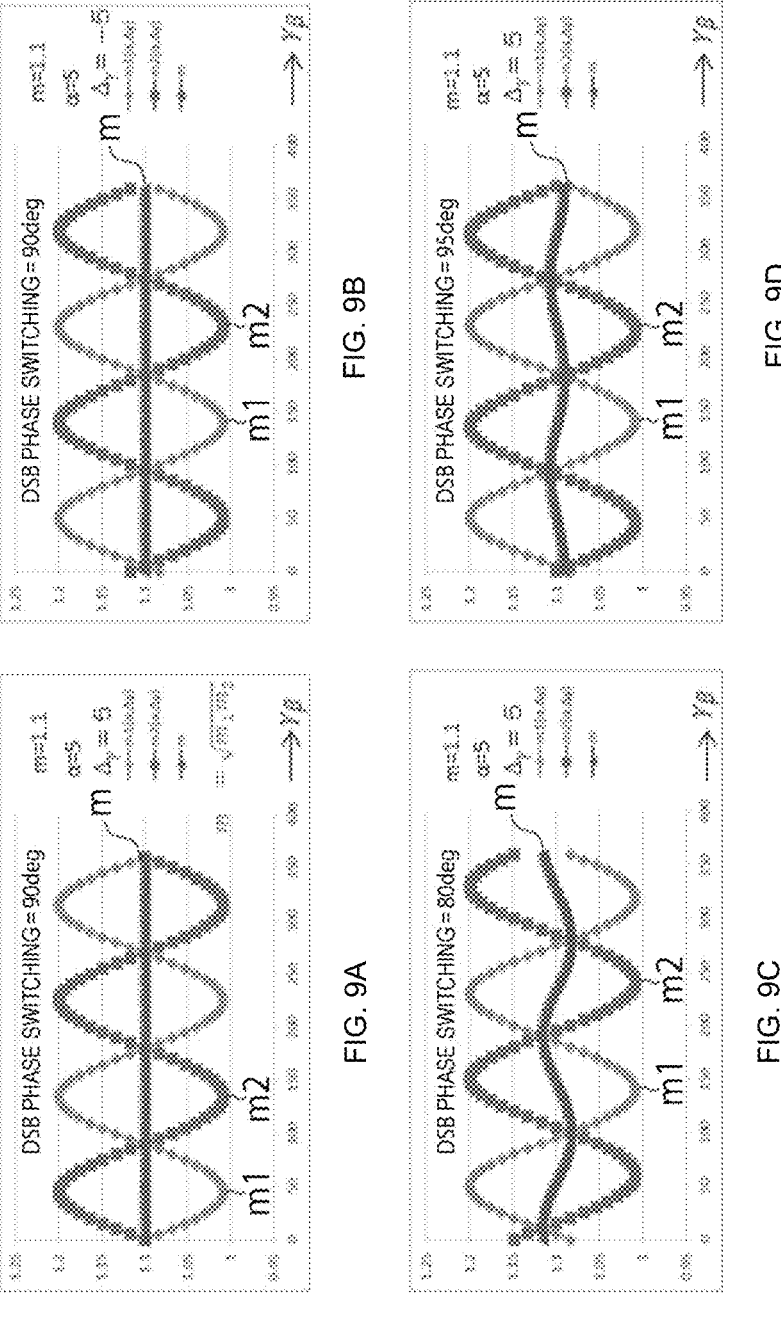
FIGS. 9A, 9B, 9C, and 9D are diagrams illustrating simulation results of relations with gain differences in cases where a phase difference is changed.

FIGS. 9A, 9B, 9C, and 9D are diagrams illustrating simulation results of relations with the gain differences m, m1, and m2 in a case where the phase difference γβ is changed in the reception apparatus 1 according to the first embodiment. The vertical axis represents values of the gain differences m, m1, and m2, and the horizontal axis represents a phase difference γβ. FIGS. 9A and 9B illustrate a case where the phase difference between the output signals of the phase-shift converter 306a and phase-shift converter 306b is 90 degrees. FIG. 9C illustrates a case where the phase difference between the output signals is 80 degrees, and FIG. 9D illustrates a case where the phase difference between the output signals is 95 degrees.

As illustrated in FIGS. 9A and 9B, the gain difference m remains 1.1 even if the phase difference γβ is changed. In other words, the gain difference is reduced by a width error detection circuit 52 adjusting the first resistance value RI and the second resistance value RQ so that the gain on the quadrature side is multiplied by 1.1 times, for example. Meanwhile, the gain differences m1, m2 indicate a variation of about 20 percent due to the change of the phase difference γβ, and it is difficult to reduce the gain difference only with either one of the gain differences m1 and m2.

Furthermore, as illustrated in FIGS. 9C and 9D, even if the phase difference between the output signals of the phase-shift converter 306a and phase-shift converter 306b is shifted to 80 degrees to 95 degrees from 90 degrees, a variation of the gain difference m with respect to the phase difference γβ is reduced to about 5 percent. As can be seen from the above, a change in the gain difference m with respect to the variation in the phase difference between the output signals of the phase-shift converter 306a and phase-shift converter 306b is reduced.

Figure 10:
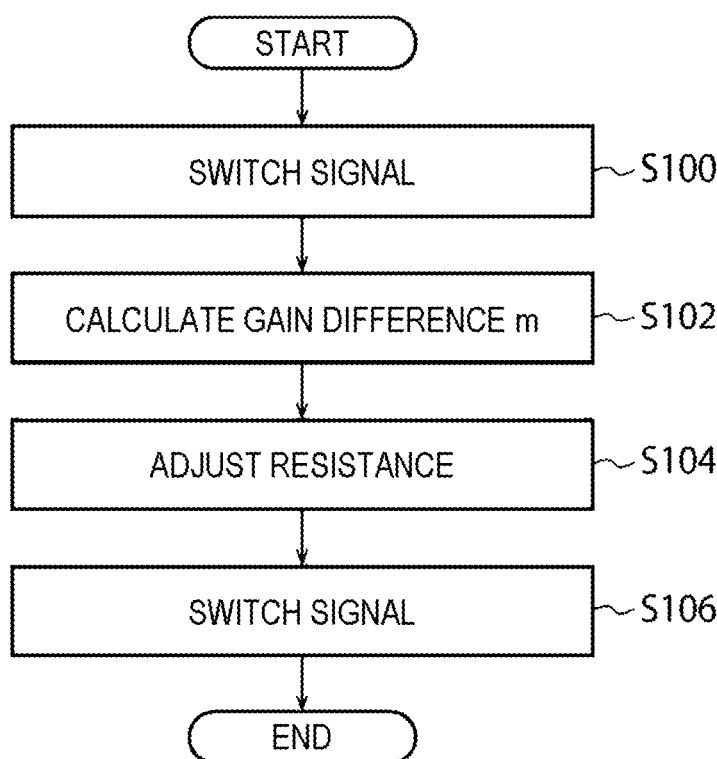
FIG. 10 is a flowchart illustrating an example of processing of adjusting a gain difference.

FIG. 10 is a flowchart illustrating an example of processing of adjusting the gain difference m. As illustrated in FIG. 10, under control of the signal processing unit 50, in the first signal switch 200, the reception apparatus 1 brings the switching element SW0 into the non-conductive state, and brings the switching element SW1 into the conductive state (Step S100).

Next, the error detection circuit 52 controls the second signal switch 302 and the third signal switch 308 to switch signals, and calculates the gain difference m according to Mathematical Formulas (16) to (18) (Step S102). Subsequently, on the basis of the gain difference m, the error detection circuit 52 adjusts the first resistance value $R_I$ and second resistance value $R_Q$, which are for gain adjustment and included in the in-phase-side current-to-voltage conversion unit 208I and the quadrature-side current-to-voltage conversion unit 208Q, respectively, so that the gain difference is reduced (Step S104).

Next, under control of the signal processing unit 50, in the first signal switch 200, the switching element SW0 is brought into the conductive state, the switching element SW1 is brought into the non-conductive state (Step S106) to end processing of adjusting the gain difference m.

As described above, according to the present embodiment, at a time of calibration for adjusting the gain difference m, the error detection signal generation unit 30 outputs the four-phase amplitude error detection signals LM0(45), LM0(−45), LM90(45), and LM90(−45) that have the frequency $\omega_L$. By setting the phase difference between the amplitude error detection signal LM0(45) and the amplitude error detection signal LM0(−45) to 90 degrees and setting the phase difference between the amplitude error detection signal LM90(45) and the amplitude error detection signal LM90(−45) to 90 degrees, it is possible to estimate, with higher accuracy, the gain difference m for which an effect of an error due to a phase difference γβ is reduced. With this arrangement, an error detection signal can be configured with a double-sideband (DSB) signal, and the error detection signal generation unit 30 can be further downsized as compared with a case of using a single-sideband (SSB) signal.

Furthermore, on the basis of the gain difference m, the error detection circuit 52 adjusts the first resistance value $R_I$ and the second resistance value $R_Q$, which are for gain adjustment and included in the in-phase-side current-to-voltage conversion unit 208I and the quadrature-side current-to-voltage conversion unit 208Q, so as to reduce the gain difference, and therefore, it is possible to equalize amplitudes of the I signal and Q signal to ensure a favorable image response rejection ratio (IMRR).

Second Embodiment

A reception apparatus 1 according to a second embodiment is different from the reception apparatus 1 according to the first embodiment in that a duty cycle of local signals input to an in-phase-side mixer 204I and a quadrature-side mixer 204Q is set to percent, and low-noise transconductance amplifiers 202a and 202b are disposed on an in-phase side and a quadrature side, respectively. Hereinafter, differences from the reception apparatus 1 according to the first embodiment will be described.

Figure 11:
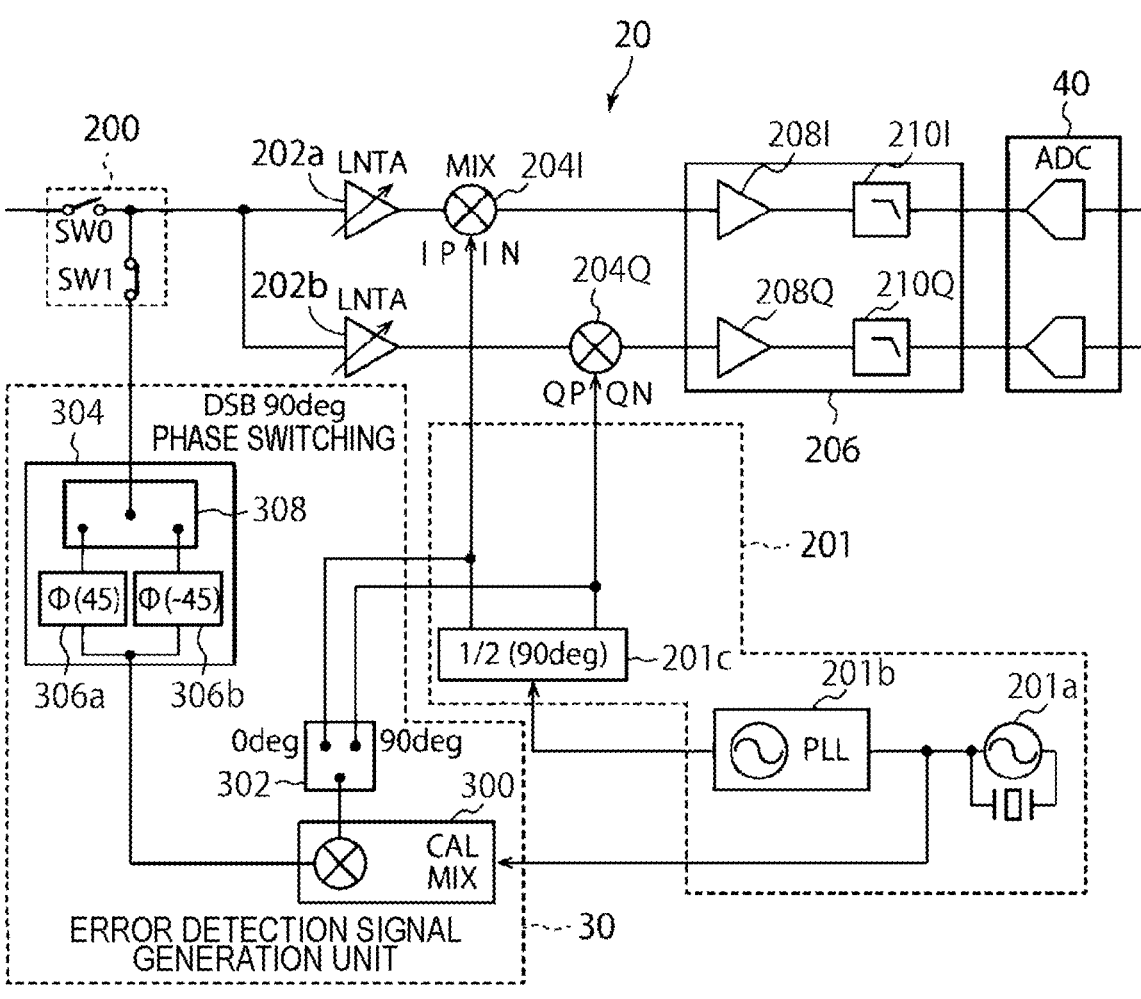
FIG. 11 is a block diagram illustrating a configuration example of a reception apparatus 1 according to a second embodiment.

FIG. 11 is a block diagram illustrating a configuration example of the reception apparatus 1 according to the second embodiment. The reception apparatus 1 includes the low-noise transconductance amplifiers 202a and 202b on the in-phase side and the quadrature side, respectively. In a case where the duty cycle is increased, or the like, current supplied to each of the in-phase-side mixer 204I and the quadrature-side mixer 204Q may be insufficient. In this case, it is only required to dispose the low-noise transconductance amplifiers 202a and 202b in systems on the in-phase side and the quadrature side, respectively, to amplify current signals. Furthermore, a signal generation circuit 201, a first signal LO0 is output as an IP signal, a third signal LO180 is output as an IN signal, a second signal LO90 is output as a QP signal, and a fourth signal LO270 is output as a QN signal.

As described above, with the reception apparatus 1 according to the present embodiment, similarly to the reception apparatus 1 according to the first embodiment, at a time of calibration for adjusting a gain difference m, an error detection signal generation unit 30 outputs four-phase amplitude error detection signals LM0(45), LM0(−45), LM90(45), and LM90(−45) that have a frequency $\omega_L$. In this case, by setting a phase difference between the amplitude error detection signal LM0(45) and the amplitude error detection signal LM0(−45) to 90 degrees and setting a phase difference between the amplitude error detection signal LM90(45) and the amplitude error detection signal LM90 (−45) to 90 degrees, it is possible to cancel a numerator and denominator in Mathematical Formula (18), and estimate, with higher accuracy, the gain difference m for which an effect of an error due to a phase difference γβ is reduced.

Furthermore, because the current signals are amplified by the low-noise transconductance amplifier 202*a* on the in-phase side and the low-noise transconductance amplifier 202*b* on the quadrature side, current supplied to each of the in-phase side and quadrature side can be increased as compared with a case where only the low-noise transconductance amplifier 202*a* is provided.

Third Embodiment

The technology according to the present disclosure is applicable to a technology called Internet of things (IoT), which is a so-called "Internet of things". The IoT is a mechanism in which an IoT device 9100, which is a "thing", is connected to another IoT device 9003, the Internet, a cloud 9005, or the like, and these devices exchange information for mutual control. The IoT can be utilized in various industries such as agriculture, housing, automotive, manufacturing, distribution, and energy industries.

Figure 12:
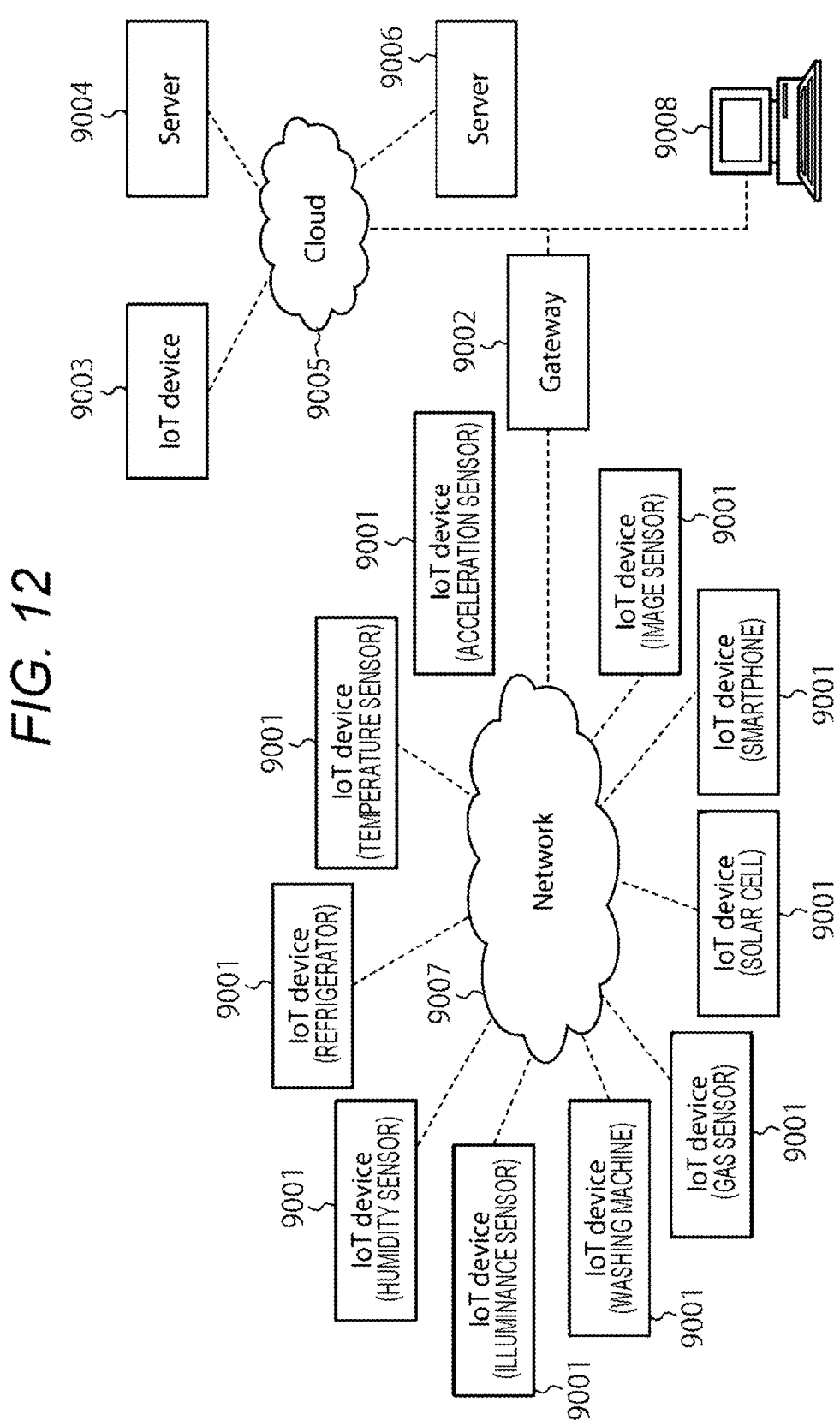
FIG. 12 is a diagram illustrating an application example of a reception apparatus according to the present embodiment.

FIG. 12 is a diagram illustrating an example of a schematic configuration of an IoT system 9000 to which the technology according to the present disclosure may be applied. An IoT device 9001 includes various sensors or the like, such as a temperature sensor, a humidity sensor, an illuminance sensor, an acceleration sensor, a distance sensor, an image sensor, a gas sensor, and a human sensor. Furthermore, the IoT device 9001 may include terminals such as a smartphone, a mobile phone, a wearable terminal, and a game machine. The IoT device 9001 is powered by an AC power supply, a DC power supply, a battery, a wireless charging system, a so-called energy harvesting system, or the like. The IoT device 9001 can communicate by wire, wirelessly, by proximity wireless communication, or the like. As a communication method, 3G/LTE (registered trademark), Wi-Fi (registered trademark), IEEE 802.15.4, Bluetooth (registered trademark), ZigBee (registered trademark), Z-Wave, or the like is suitably used. The IoT device 9001 may perform communication by switching some of these communication means.

The IoT device 9001 may form a one-to-one, star-like, tree-like, or mesh-like network. The IoT device 9001 may be connected to an external cloud 9005 directly or through a gateway 9002. An address is assigned to the IoT device 9001 by IPv4, IPv6, 6LoWPAN, or the like. Data collected from the IoT device 9001 is transmitted to the another IoT device 9003, a server 9004, the cloud 9005, or the like. A timing and frequency of transmitting data from the IoT device 9001 are suitably adjusted, and the data may be compressed and transmitted. Such data may be utilized as is, or may be analyzed by a computer 9008 with various means such as statistical analysis, machine learning, data mining, cluster analysis, discriminant analysis, combinatorial analysis, or time series analysis. By utilizing such data, it is possible to provide various services such as control, warning, monitoring, visualization, automation, and optimization.

The technology according to the present disclosure is also applicable to devices and services for home. The IoT device 9001 at home includes a washing machine, a dryer, a hair dryer, a microwave oven, a dishwasher, a refrigerator, an oven, a rice cooker, a cooking appliance, a gas appliance, a fire alarm, a thermostat, an air conditioner, a television, a recorder, an audio system, lighting equipment, a water heater, a hot-water dispenser, a vacuum cleaner, an electric fan, an air purifier, a security camera, a lock, a door/shutter opening/closing device, a sprinkler, a toilet, a thermometer, a bathroom scale, a blood pressure meter, and the like. Moreover, the IoT device 9001 may include a solar cell, a fuel cell, a storage battery, a gas meter, a power meter, and a distribution board.

The communication method of the IoT device 9001 at home is desirably a low-power-consumption type communication method. Furthermore, the IoT device 9001 may perform communication with Wi-Fi indoors and with 3G/LTE (registered trademark) outdoors. An external server 9006 for IoT device control may be installed on the cloud 9005 to control the IoT device 9001. The IoT device 9001 transmits data of, for example, a state of a home appliance, temperature, humidity, or power usage, or presence or absence of a person or animal indoors and outdoors. Data transmitted from the home appliance is accumulated in the external server 9006 via the cloud 9005. A new service is provided on the basis of such data. Such an IoT device 9001 can be controlled by voice by utilizing voice recognition technology.

Furthermore, by directly sending information from various home appliances to a television, states of the various home appliances can be visualized. Moreover, by various sensors determining presence or absence of a resident and sending data to an air conditioner, a lighting, or the like, power thereof can be turned on and off. Moreover, an advertisement can be displayed on displays provided on the various home appliances, via the Internet.

An example of the IoT system 9000 to which the technology according to the present disclosure may be applied has been described above. The technology according to the present disclosure may be suitably applied to a reception apparatus for communication between various kinds of devices among the above-described configurations.

Note that the technology according to the present disclosure can be applied not only to the applications described above, but also to various kinds of communications using a high frequency, for example. For example, the technology can be used not only at home as described above, but also for communication in an industry such as a factory. Furthermore, for example, the technology may be implemented in a mobile object, and mounted on a device that performs communication. The present invention is not limited thereto, and can be implemented in various kinds of applications.

The embodiments described above may have the following forms.

(1)

A reception apparatus includes an in-phase-side mixer that mixes a predetermined high-frequency component and an in-phase-side local signal, and outputs the mixed signal as an in-phase-side mixed signal, a quadrature-side mixer that mixes the predetermined high-frequency component and a quadrature-side local signal orthogonal to the in-phase-side local signal, and outputs the mixed signal as a quadrature-side mixed signal, an error detection signal generation unit that generates four-phase detection signals having same frequencies as frequencies of the in-phase-side local signal and quadrature-side local signal, and each having a different phase, and a signal processing unit that generates a gain difference between an in-phase-side signal according to the in-phase-side mixed signal and a quadrature-side signal according to the quadrature-side mixed signal, on the basis of respective output signals of the in-phase-side mixer and quadrature-side mixer in a case where each of the four-phase detection signals, each having a different phase, is the predetermined high-frequency component.

(2)

The reception apparatus according to (1), the reception apparatus further including a switching unit that outputs, at a time of reception, an RF signal as the predetermined high-frequency component to the in-phase-side mixer and the quadrature-side mixer, and outputs, at a time of adjustment, each of the four-phase detection signals, each having a different phase, as the predetermined high-frequency component to the in-phase-side mixer and the quadrature-side mixer.

(3)

The reception apparatus according to (1) or (2), in which the four-phase detection signals include a first detection signal having a first phase, a second detection signal having a phase different from the phase of the first detection signal in a range of 80 degrees to 100 degrees, a third detection signal having a phase different from the phases of the first detection signal and second detection signal, and a fourth detection signal having a phase different from the phases of the first detection signal and second detection signal and having a phase different from the phase of the third detection signal in a range of 80 degrees to 110 degrees.

(4)

The reception apparatus according to (1) or (2), in which the four-phase detection signals include a first detection signal having a first phase, a second detection signal having a phase different from the phase of the first detection signal by 90 degrees, a third detection signal having a phase different from the phases of the first detection signal and second detection signal, and a fourth detection signal having a phase different from the phases of the first detection signal and second detection signal and having a phase different from the phase of the third detection signal by 90 degrees.

(5)

The reception apparatus according to (3) or (4), the reception apparatus further including an in-phase-side filter circuit that selectively passes the predetermined high-frequency component in a signal based on the in-phase-side mixed signal, and a quadrature-side filter circuit that selectively passes the predetermined high-frequency component in a signal based on the quadrature-side mixed signal.

(6)

The reception apparatus according to (5), in which the signal processing unit generates the gain difference on the basis of multiplication of a first ratio of a magnitude of a first in-phase-side signal based on a first in-phase output signal output from the in-phase-side filter circuit on the basis of the first detection signal and a third in-phase output signal output from the in-phase-side filter circuit on the basis of the third detection signal to a magnitude of a first quadrature-side signal based on a first quadrature output signal output from the quadrature-side filter circuit on the basis of the first detection signal and a third quadrature output signal output from the quadrature-side filter circuit on the basis of the third detection signal by a second ratio of a magnitude of a second in-phase-side signal based on a second in-phase output signal output from the in-phase-side filter circuit on the basis of the second detection signal and a fourth in-phase output signal output from the in-phase-side filter circuit on the basis of the fourth detection signal to a magnitude of a first quadrature-side signal based on a first quadrature output signal output from the quadrature-side filter circuit on the basis of the first detection signal and a third quadrature output signal output from the quadrature-side filter circuit on the basis of the third detection signal.

(7)

The reception apparatus according to (5) or (6), the reception apparatus further including an in-phase-side current-to-voltage conversion unit that performs current-to-voltage conversion on the in-phase-side mixed signal and outputs the converted in-phase-side mixed signal to the in-phase-side filter circuit, and an in-phase-side current-to-voltage conversion unit that performs current-to-voltage conversion on the quadrature-side mixed signal and outputs the converted quadrature-side mixed signal to the quadrature-side filter circuit, in which gains of the in-phase-side current-to-voltage conversion unit and the in-phase-side current-to-voltage conversion unit is adjusted on the basis of the gain difference.

(8)

The reception apparatus according to (1), the reception apparatus further including a signal generation circuit that generates the in-phase-side local signal and the quadrature-side local signal on the basis of a first signal and a second signal having a phase different from a phase of the first signal by 90 degrees, in which the error detection signal generation unit generates the four-phase detection signals on the basis of the first signal and the second signal.

(9)

The reception apparatus according to (8), in which the signal generation circuit generates the first signal having a duty cycle of 50 percent, the second signal, a third signal that is an inverted signal of the first signal, a fourth signal that is an inverted signal of the second signal, and generates the in-phase-side local signal and the quadrature-side local signal on the basis of the first signal, second signal, third signal, and fourth signal.

(10)

The reception apparatus according to (9), in which the signal generation circuit includes a conversion circuit that converts a reference signal having a first frequency into a second frequency signal having a frequency same as a frequency of the in-phase-side local signal, and a 90-degree phase conversion circuit that generates the second signal having a duty cycle of 50 percent and having a phase shifted by 90 degrees from the first signal having a duty cycle of 50 percent and being generated by the conversion circuit, and generates the third signal that is an inverted signal of the first signal and the fourth signal that is an inverted signal of the second signal, and generates the in-phase-side local signal and the quadrature-side local signal on the basis of the first signal, the second signal, the third signal, and the fourth signal.

(11)
The reception apparatus according to (10), the reception apparatus further including a logical AND circuit that generates, by determining a logical AND of two signals among the first signal, the second signal, the third signal, and the fourth signal, a first local signal having a duty cycle of 25 percent, a second local signal having a phase different from a phase of the first local signal by 90 degrees, a third local signal having a phase different from the phase of the first local signal by 180 degrees, and a fourth local signal having a phase different from the phase of the first local signal by 270 degrees, in which the in-phase-side local signal includes a signal based on the first local signal and the third local signal, and the quadrature-side local signal includes a signal includes a signal based on the second local signal and the fourth local signal.

(12)
The reception apparatus according to (8),
in which the error detection signal generation unit includes
a first signal switch that selectively outputs either the first signal or the second signal,
a phase converter that generates, on the basis of a signal output from the first signal switch, two signals having phases different from each other by 90 degrees, and
a second signal switch that selectively outputs either one of the two signals output by the phase converter.

(13)
The reception apparatus according to (5), the reception apparatus further including an AD conversion circuit that converts an output from each of the in-phase-side filter circuit and the quadrature-side filter circuit into a digital signal, in which the signal processing unit generates the gain difference on the basis of an output from the AD conversion circuit.

(14)
The reception apparatus according to (13), the reception apparatus further including
a phase shifter that changes a phase of a signal of either an output based on the in-phase-side filter circuit, the output being output from the AD conversion circuit, or an output based on the quadrature-side filter circuit, the output being output from the AD conversion circuit, and
an adder circuit that adds an output from the AD conversion circuit and an output from the phase shifter.

(15)
The reception apparatus according to (14), in which the phase shifter changes a phase of a signal by 90 degrees.

(16)
The reception apparatus according to (1),
in which the detection signal generated by the error detection signal generation unit includes a double-sideband signal.

REFERENCE SIGNS LIST

1 Reception apparatus
30 Error detection signal generation unit
40 AD conversion unit
52 Error detection circuit 54 Phase shifter
56 Adder
200 First signal switch
201 Signal generation circuit
201b PLL synthesizer
201c 90-degree phase-shift converter
201d Logical AND circuit
204I In-phase-side mixer
204Q Quadrature-side mixer
208I In-phase-side current-to-voltage conversion unit
208Q Quadrature-side current-to-voltage conversion unit
210I In-phase-side filter circuit
210Q Quadrature-side filter circuit
300 Mixer
302 Second signal switch
304 Phase-shift switch
306a, 306b Phase-shift converter
308 Third signal switch

The invention claimed is:

1. A reception apparatus, comprising:
an in-phase-side mixer configured to:
mix a specific high-frequency component and an in-phase-side local signal to generate an in-phase-side mixed signal; and
output the in-phase-side mixed signal;
a quadrature-side mixer configured to:
mix the specific high-frequency component and a quadrature-side local signal to generate a quadrature-side mixed signal, wherein
the quadrature-side local signal is orthogonal to the in-phase-side local signal; and
output the quadrature-side mixed signal;
an error detection signal generation unit configured to generate four-phase detection signals having same frequencies as frequencies of the in-phase-side local signal and the quadrature-side local signal, wherein
each of the four-phase detection signals having a different phase; and
a signal processing unit configured to generate a gain difference between an in-phase-side signal and a quadrature-side signal, based on respective output signals of the in-phase-side mixer and quadrature-side mixer in a case where the each of the four-phase detection signals is the specific high-frequency component.

2. The reception apparatus according to claim 1 further comprising a switching unit configured to:
output, at a time of reception, a radio frequency (RF) signal as the specific high-frequency component to the in-phase-side mixer and the quadrature-side mixer, and
output, at a time of adjustment, the each of the four-phase detection signals as the specific high-frequency component to the in-phase-side mixer and the quadrature-side mixer.

3. The reception apparatus according to claim 1, wherein the four-phase detection signals include;
a first detection signal having a first phase,
a second detection signal having a second phase different from the first phase, wherein
the second phase is in a range of 80 degrees to 110 degrees,
a third detection signal having a third phase different from the first phase and the second phase, and
a fourth detection signal having a fourth phase different from the first phase, the second phase, and the third phase, wherein the fourth phase is in a range of 80 degrees to 110 degrees.

4. The reception apparatus according to claim 3, the reception apparatus further comprising:

an in-phase-side filter circuit configured to selectively pass a specific low-frequency component from the in-phase-side mixed signal; and a quadrature-side filter circuit configured to selectively pass a specific low-frequency component from the quadrature-side mixed signal.

5. The reception apparatus according to claim 4, wherein the signal processing unit generates the gain difference on a basis of multiplication of a first ratio and a second ratio, the first ratio is a ratio of a magnitude of a first in-phase-side signal based on a first in-phase output signal and a third in-phase output signal to a magnitude of a first quadrature-side signal based on a first quadrature output signal and a third quadrature output signal, the first in-phase output signal is output from the in-phase-side filter circuit based on the first detection signal, the third in-phase output signal is output from the in-phase-side filter circuit based on the third detection signal, the first quadrature output signal is output from the quadrature-side filter circuit based on the first detection signal, the third quadrature output signal is output from the quadrature-side filter circuit based on the third detection signal, the second ratio is a ratio of a magnitude of a second in-phase-side signal based on a second in-phase output signal and a fourth in-phase to the magnitude of the first quadrature-side signal and the third quadrature output signal, the second in-phase output signal is output from the in-phase-side filter circuit based on the second detection signal, and the fourth in-phase is output signal output from the in-phase-side filter circuit based on the fourth detection signal.

6. The reception apparatus according to claim 4, further comprising:

an in-phase-side current-to-voltage conversion unit configured to:

perform current-to-voltage conversion on the in-phase-side mixed signal; and output the current-to-voltage converted in-phase-side mixed signal to the in-phase-side filter circuit; and a quadrature-side current-to-voltage conversion unit configured to:

perform current-to-voltage conversion on the quadrature-side mixed signal; and output the current-to-voltage converted quadrature-side mixed signal to the quadrature-side filter circuit, wherein a gain of each of the in-phase-side current-to-voltage conversion unit and the quadrature-side current-to-voltage conversion unit is adjusted based on the gain difference.

7. The reception apparatus according to claim 4, further comprising an AD conversion circuit configured to convert an output from each of the in-phase-side filter circuit and the quadrature-side filter circuit into a digital signal, wherein the signal processing unit is further configured to generate the gain difference based on the output from the AD conversion circuit.

8. The reception apparatus according to claim 7, further comprising:

a phase shifter configured to change a phase of a signal of one of a first output based on the in-phase-side filter circuit or a second output based on the quadrature-side filter circuit, wherein the first output is output from the AD conversion circuit, and the second output is output from the AD conversion circuit; and an adder circuit configured to add one of the first output or the second output and an output from the phase shifter.

9. The reception apparatus according to claim 8, wherein the phase shifter is further configured to change the phase of the signal by 90 degrees.

10. The reception apparatus according to claim 1, wherein the four-phase detection signals include;

a first detection signal having a first phase, a second detection signal having a second phase different from the first phase by 90 degrees, a third detection signal having a third phase different from the first phase and the second phase, and a fourth detection signal having a fourth phase different from the first phase and the second phase, wherein the fourth phase is different from the third phase by 90 degrees.

11. The reception apparatus according to claim 1, further comprising a signal generation circuit configured to generate the in-phase-side local signal and the quadrature-side local signal, based on a first signal and a second signal, wherein a phase of the second signal is different from a phase of the first signal by 90 degrees, the error detection signal generation unit is further configured to generate the four-phase detection signals based on the first signal and the second signal.

12. The reception apparatus according to claim 11, wherein the signal generation circuit is further configured to:

generate the first signal having a duty cycle of 50 percent, the second signal, a third signal that is an inverted signal of the first signal, a fourth signal that is an inverted signal of the second signal, and generate the in-phase-side local signal and the quadrature-side local signal based on the first signal, the second signal, the third signal, and the fourth signal.

13. The reception apparatus according to claim 12, wherein the signal generation circuit includes:

a conversion circuit configured to convert a first frequency of a reference signal into a second frequency, wherein the second frequency is same as a frequency of the in-phase-side local signal, and a 90-degree phase conversion circuit configured to:

generate the second signal having the duty cycle of 50 percent, wherein a phase of the second signal is shifted by 90 degrees from the first signal, having the duty cycle of 50 percent, generated by the signal generation circuit, and generate the third signal and the fourth signal, and generate the in-phase-side local signal and the quadrature-side local signal, based on the first signal, the second signal, the third signal, and the fourth signal.

14. The reception apparatus according to claim 13, further comprising a logical AND circuit configured to generate, based on a logical AND of two signals among the first signal, the second signal, the third signal, and the fourth signal, a first local signal having a duty cycle of 25 percent, a second local signal having a phase different from a phase of the first local signal by 90 degrees, a third local signal having a phase different from the phase of the first local signal by 180 degrees, and a fourth local signal having a phase different from the phase of the first local signal by 270 degrees, wherein the in-phase-side local signal includes a signal based on the first local signal and the third local signal, and the quadrature-side local signal includes a signal based on the second local signal and the fourth local signal.

15. The reception apparatus according to claim 11, wherein the error detection signal generation unit includes a first signal switch configured to selectively output at least one of the first signal or the second signal, a phase converter configured to generate, based on at least one of the first signal or the second signal output from the first signal switch, a third signal and a fourth signal having phases different from each other by 90 degrees, and a second signal switch configured to selectively output at least one of the third signal or the fourth signal two signals output by the phase converter.

16. The reception apparatus according to claim 1, wherein a four-phase detection signal of the four-phase detection signals generated by the error detection signal generation unit includes a double-sideband signal.

\* \* \* \* \*